(12) United States Patent
Yamazaki et al.

(10) Patent No.: US 10,468,506 B2
(45) Date of Patent: Nov. 5, 2019

(54) SEMICONDUCTOR DEVICE AND METHOD FOR FABRICATING THE SAME

(71) Applicant: Semiconductor Energy Laboratory Co., Ltd., Atsugi-shi, Kanagawa-ken (JP)

(72) Inventors: Shunpei Yamazaki, Tokyo (JP);
Hideomi Suzawa, Kanagawa (JP);
Shinya Sasagawa, Kanagawa (JP);
Motomu Kurata, Kanagawa (JP);
Masashi Tsubuku, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/194,444

(22) Filed: Nov. 19, 2018

(65) Prior Publication Data

US 2019/0103478 A1    Apr. 4, 2019

Related U.S. Application Data

(62) Division of application No. 15/461,575, filed on Mar. 17, 2017, now Pat. No. 10,134,879, which is a
(Continued)

(30) Foreign Application Priority Data

Sep. 14, 2012 (JP) .................................. 2012-203385

(51) Int. Cl.
*H01L 29/66* (2006.01)
*H01L 29/786* (2006.01)
(Continued)

(52) U.S. Cl.
CPC .. *H01L 29/66969* (2013.01); *H01L 21/02565* (2013.01); *H01L 27/127* (2013.01);
(Continued)

(58) Field of Classification Search
CPC ......... H01L 29/66969; H01L 29/78696; H01L 29/7869; H01L 21/0242; H01L 29/24;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Mouloucoulaye Inoussa
(74) *Attorney, Agent, or Firm* — Fish & Richardson P.C.

(57) ABSTRACT

The on-state characteristics of a transistor are improved and thus, a semiconductor device capable of high-speed response and high-speed operation is provided. A highly reliable semiconductor device showing stable electric characteristics is made. The semiconductor device includes a transistor including a first oxide layer; an oxide semiconductor layer over the first oxide layer; a source electrode layer and a drain electrode layer in contact with the oxide semiconductor layer; a second oxide layer over the oxide semiconductor layer; a gate insulating layer over the second oxide layer; and a gate electrode layer over the gate insulating layer. An end portion of the second oxide layer and an
(Continued)

end portion of the gate insulating layer overlap with the source electrode layer and the drain electrode layer.

6 Claims, 25 Drawing Sheets

Related U.S. Application Data division of application No. 14/021,618, filed on Sep. 9, 2013, now Pat. No. 9,601,632.

(51) Int. Cl.
    *H01L 21/02*     (2006.01)
    *H01L 27/12*     (2006.01)
    *H01L 27/146*     (2006.01)

(52) U.S. Cl.
    CPC .... H01L 27/1225 (2013.01); H01L 27/14616 (2013.01); H01L 27/14689 (2013.01); H01L 29/7869 (2013.01); H01L 29/78696 (2013.01)

(58) Field of Classification Search
    CPC ......... H01L 21/02472; H01L 21/02483; H01L 21/02502; H01L 21/02554; H01L 21/02565; H01L 29/78693
    USPC ............... 257/43, E21.46, E29.296; 438/104
    See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,203,143 B2 | 6/2012 | Imai |
| 8,237,166 B2 | 8/2012 | Kumomi et al. |
| 8,492,840 B2 | 7/2013 | Yamazaki et al. |
| 8,502,221 B2 | 8/2013 | Yamazaki |
| 8,669,556 B2 | 3/2014 | Yamazaki et al. |
| 8,680,522 B2 | 3/2014 | Yamazaki et al. |
| 8,692,252 B2 | 4/2014 | Takata et al. |
| 8,785,241 B2 | 7/2014 | Sasagawa et al. |
| 8,871,565 B2 | 10/2014 | Yamazaki et al. |
| 8,890,159 B2 | 11/2014 | Yamazaki et al. |
| 8,901,557 B2 | 12/2014 | Yamazaki |
| 8,952,381 B2 | 2/2015 | Yamazaki |
| 8,994,021 B2 | 3/2015 | Yamazaki et al. |
| 9,105,668 B2 | 8/2015 | Yamazaki et al. |
| 9,318,613 B2 | 4/2016 | Yamazaki |
| 9,331,208 B2 | 5/2016 | Yamazaki et al. |
| 9,379,136 B2 | 6/2016 | Sasagawa et al. |
| 9,640,642 B2 | 5/2017 | Sasagawa et al. |
| 9,711,655 B2 | 7/2017 | Yamazaki et al. |
| 9,837,513 B2 | 12/2017 | Sasagawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0140100 A1 | 6/2011 | Takata et al. |
| 2011/0240990 A1 | 10/2011 | Yamazaki |
| 2011/0240991 A1* | 10/2011 | Yamazaki ........... H01L 29/7831 257/43 |
| 2011/0254061 A1 | 10/2011 | Yan et al. |
| 2011/0303913 A1 | 12/2011 | Yamazaki et al. |

(56) References Cited

U.S. PATENT DOCUMENTS

| | | | |
|---|---|---|---|
| 2012/0132903 A1 | 5/2012 | Yamazaki et al. | |
| 2012/0138922 A1* | 6/2012 | Yamazaki | H01L 29/7869 257/43 |
| 2012/0146713 A1 | 6/2012 | Kim et al. | |
| 2013/0009209 A1 | 1/2013 | Yamazaki | |
| 2013/0075735 A1* | 3/2013 | Watanabe | H01L 29/7869 257/57 |
| 2013/0187151 A1* | 7/2013 | Yamazaki | H01L 29/786 257/43 |
| 2013/0187152 A1* | 7/2013 | Yamazaki | H01L 29/78693 257/43 |
| 2013/0196468 A1* | 8/2013 | Yamazaki | H01L 29/66742 438/104 |
| 2013/0203214 A1* | 8/2013 | Isobe | H01L 21/0237 438/104 |
| 2013/0240802 A1 | 9/2013 | Miki et al. | |
| 2013/0320334 A1 | 12/2013 | Yamazaki et al. | |
| 2013/0334533 A1 | 12/2013 | Yamazaki | |
| 2014/0034945 A1 | 2/2014 | Tokunaga et al. | |
| 2014/0042433 A1 | 2/2014 | Yamazaki | |
| 2014/0183530 A1 | 7/2014 | Yamazaki et al. | |
| 2015/0325704 A1 | 11/2015 | Yamazaki et al. | |
| 2016/0225908 A1 | 8/2016 | Yamazaki | |
| 2016/0240694 A1 | 8/2016 | Yamazaki et al. | |
| 2017/0309754 A1 | 10/2017 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-073701 A | 3/2007 |
| JP | 2010-067954 A | 3/2010 |
| JP | 2011-124360 A | 6/2011 |
| JP | 2011-171721 A | 9/2011 |
| JP | 2011-228695 A | 11/2011 |
| JP | 2012-019207 A | 1/2012 |
| JP | 2012-039102 A | 2/2012 |
| JP | 2012-134475 A | 7/2012 |
| TW | 201222823 | 6/2012 |
| TW | 201227833 | 7/2012 |
| TW | 201236157 | 9/2012 |
| WO | WO-2004/114391 | 12/2004 |
| WO | WO-2011/089846 | 7/2011 |
| WO | WO-2011/122364 | 10/2011 |
| WO | WO-2012/036104 | 3/2012 |
| WO | WO-2012/070676 | 5/2012 |
| WO | WO-2012/073844 | 6/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters) Jul. 31, 2000, vol. 85, No. 5, pp. 1012-1015.

Taiwanese Office Action (Application No. 102131801) dated Dec. 20, 2016.

Taiwanese Office Action (Application No. 106116727) dated Dec. 20, 2017.

\* cited by examiner

SEMICONDUCTOR DEVICE AND METHOD FOR FABRICATING THE SAME

CROSS-REFERENCE TO RELATED APPLICATIONS

This application is a divisional of U.S. application Ser. No. 15/461,575, filed Mar. 17, 2017, now allowed, which is a divisional of U.S. application Ser. No. 14/021,618, filed Sep. 9, 2013, now U.S. Pat. No. 9,601,632, which claims the benefit of a foreign priority application filed in Japan as Serial No. 2012-203385 on Sep. 14, 2012, all of which are incorporated by reference.

BACKGROUND OF THE INVENTION

1. Field of the Invention

The present invention relates to a semiconductor device and a method for fabricating the semiconductor device.

Note that a semiconductor device in this specification refers to all devices which can function by utilizing semiconductor characteristics, and electro-optical devices, semiconductor circuits, and electronic devices are all semiconductor devices.

2. Description of the Related Art

Attention has been focused on a technique for forming a transistor including a semiconductor thin film formed over a substrate having an insulating surface (also referred to as a thin film transistor). The transistor is applied to a wide range of electronic devices such as an integrated circuit (IC) or an image display device (a display device). A silicon-based semiconductor material is widely known as a material for a semiconductor thin film applicable to a transistor. As another material, a semiconductor material using oxide has been attracting attention.

For example, a transistor including an oxide (an oxide semiconductor) containing indium (In), gallium (Ga), and zinc (Zn) is disclosed in Patent Document 1.

In a transistor including an oxide semiconductor layer serving as a channel formation region, an oxygen vacancy (an oxygen defect) is generated by release of oxygen from the oxide semiconductor layer, and a carrier is generated due to the oxygen vacancy. It is known that, to solve the above problem, oxygen released from a silicon oxide film containing excessive oxygen is supplied to the oxide semiconductor layer to fill the oxygen vacancy in the oxide semiconductor layer, thereby providing a highly reliable semiconductor device with small change in electric characteristics (Patent Document 2).

REFERENCE

Patent Document

[Patent Document 1] Japanese Published Patent Application No. 2006-165528
[Patent Document 2] Japanese Published Patent Application No. 2012-19207

SUMMARY OF THE INVENTION

In a transistor including an oxide semiconductor serving as a channel formation region, a carrier is generated also by entry of an impurity such as hydrogen to the oxide semiconductor. Furthermore, entry of an impurity such as silicon causes an oxygen vacancy, so that a carrier is generated.

The carrier generated in the oxide semiconductor leads to an increase in the off-state current of the transistor and variations in threshold voltage, for example. Thus, electrical characteristics of the transistor are changed, which causes a reduction in reliability of a semiconductor device.

For an increase in the area of an integrated circuit including a transistor, high-speed operation and high-speed response of the circuit are needed. An improvement in on-state characteristics (e.g., on-state current and field-effect mobility) of the transistor enables to provide a semiconductor device with higher performance, which is capable of high-speed operation and high-speed response.

In view of the above, an object of one embodiment of the present invention is to provide a semiconductor device capable of achieving high-speed response and high-speed operation by improving on-state characteristics of a transistor. Another object of one embodiment of the present invention is to fabricate a highly reliable semiconductor device showing stable electric characteristics.

To solve the above problems, a semiconductor device of one embodiment of the present invention includes a first oxide layer, an oxide semiconductor layer over the first oxide layer, a source electrode layer and a drain electrode layer in contact with the oxide semiconductor layer, a second oxide layer over the oxide semiconductor layer, a gate insulating layer over the second oxide layer, and a gate electrode layer over the gate insulating layer. An end portion of the second oxide layer and an end portion of the gate insulating layer overlap with the source electrode layer and the drain electrode layer.

It is preferable that the first oxide layer and the second oxide layer do not contain an impurity element such as silicon, which forms a level caused by impurity in the oxide semiconductor layer, as their main constituent elements. In the case where main elements of the first oxide layer and the second oxide layer are the same as a main element of the oxide semiconductor layer, scattering at an interface between the oxide semiconductor layer and the first oxide layer and at an interface between the oxide semiconductor layer and the second oxide layer is reduced, so that field-effect mobility can be increased. Oxides which contain the same element as their main constituent elements are used for the oxide semiconductor layer, the first oxide layer, and the second oxide layer, in which case trap levels at the interfaces can be reduced and variations in threshold voltage of a transistor due to change with time or a stress test can be reduced.

By the above method, a transistor can be formed without a contact between the oxide semiconductor layer and a layer containing an impurity element such as silicon. Thus, entry of the impurity element such as silicon to the oxide semiconductor layer can be prevented, thereby providing a highly reliable semiconductor device.

One embodiment of the present invention is a semiconductor device including a first oxide layer; an oxide semiconductor layer over the first oxide layer; a source electrode layer and a drain electrode layer which are in contact with the oxide semiconductor layer; a second oxide layer over the oxide semiconductor layer, the source electrode layer, and the drain electrode layer; a gate insulating layer over the second oxide layer; and a gate electrode layer over the gate insulating layer. An end portion of the second oxide layer and an end portion of the gate insulating layer overlap with the source electrode layer and the drain electrode layer.

A top end portion of the second oxide layer may be aligned with a bottom end portion of the gate insulating layer, and a top end portion of the gate insulating layer may be aligned with a bottom end portion of the gate electrode layer. Note that the expression "aligned with" here does not require exact alignment, and includes a shape obtained by etching the second oxide layer and the gate insulating layer using the gate electrode layer as a mask.

A sidewall insulating layer in contact with a side surface of the gate electrode layer may be provided. The top end portion of the second oxide layer may be aligned with the bottom end portion of the gate insulating layer, and the top end portion of the gate insulating layer may be aligned with a bottom end portion of the sidewall insulating layer. Also in this case, the expression "aligned with" does not require exact alignment, and includes a shape obtained by etching the second oxide layer and the gate insulating layer using the sidewall insulating layer and the gate electrode layer as masks.

A well-shaped structure (also referred to as a well structure) is formed in which a bottom of the conduction band of the oxide semiconductor layer is lower energy level than the conduction bands of the first oxide layer and the second oxide layer. That is, a buried channel structure in which a channel is formed in the oxide semiconductor layer is formed. To form such a structure, the oxide semiconductor layer preferably has a depth from the vacuum level (also referred to as electron affinity) to the bottom of the conduction band which is greater than that of the first oxide layer and that of the second oxide layer. Specifically, the electron affinity of the oxide semiconductor layer is preferably higher than that of the first oxide layer and that of the second oxide layer by 0.2 eV or more.

The electron affinity can be obtained by subtracting a difference in energy between the bottom of the conduction band and a top of a valence band (what is called a band gap) from a difference in energy between the vacuum level and the top of the valence band (what is called an ionization potential).

Note that the ionization potential of an oxide semiconductor which is used for obtaining electron affinity can be measured by ultraviolet photoelectron spectroscopy (UPS) or the like. As a typical measurement device of UPS, VersaProbe (manufactured by ULVAC-PHI, Inc) is used. Further, band gap ($E_g$) can be measured by a full automatic spectroscopic ellipsometer UT-300. The energy of the bottom of the conduction band is obtained by subtracting the band gap from the value of the ionization potential. By using this method, it can be confirmed whether a buried channel is formed with the use of the stacked-layer structure disclosed in this specification.

The first oxide layer, the second oxide layer, and the oxide semiconductor layer contain at least indium. The proportion (atomic ratio) of indium in the oxide semiconductor layer is preferably higher than that in the first oxide layer and that in the second oxide layer. Alternatively, the first oxide layer, the second oxide layer, and the oxide semiconductor layer may contain at least indium, zinc, and gallium. In this case, the proportion of indium in the oxide semiconductor layer is preferably higher than that in the first oxide layer and that in the second oxide layer. In addition, the proportion of gallium in each of the first oxide layer and the second oxide layer is preferably higher than that in the oxide semiconductor layer.

An oxide insulating layer containing excessive oxygen may be provided over the gate electrode layer. The amount of oxygen released from the oxide insulating layer containing excessive oxygen, which is converted into oxygen atoms in thermal desorption spectroscopy, is preferably greater than or equal to $1.0 \times 10^{19}$ atoms/cm$^3$. The oxide insulating layer containing excessive oxygen preferably contains oxygen in excess of the stoichiometric composition.

The second oxide layer and the oxide semiconductor layer may each include a crystalline region having c-axis alignment in the direction substantially perpendicular to the surface.

Another embodiment of the present invention is a method for fabricating a semiconductor device, including the steps of: stacking a first oxide layer and an oxide semiconductor layer; forming a source electrode layer and a drain electrode layer over the first oxide layer and the oxide semiconductor layer; stacking an oxide film and a gate insulating film over the source electrode layer and the drain electrode layer; forming a gate electrode layer over the oxide film and the gate insulating film; etching the oxide film and the gate insulating film to have an island shape using the gate electrode layer as a mask, thereby forming a second oxide layer and a gate insulating layer; and forming an oxide insulating layer over the source electrode layer, the drain electrode layer, the second oxide layer, the gate insulating layer, and the gate electrode layer.

Another embodiment of the present invention is a method for fabricating a semiconductor device, including the steps of: stacking a first oxide layer and an oxide semiconductor layer; forming a source electrode layer and a drain electrode layer over the first oxide layer and the oxide semiconductor layer; stacking an oxide film and a gate insulating film over the source electrode layer and the drain electrode layer; forming a gate electrode layer over the oxide film and the gate insulating film; forming an oxide insulating layer over the gate insulating film and the gate electrode layer; etching the oxide insulating layer to form a sidewall insulating layer in contact with a side surface of the gate electrode layer; and etching the oxide film and the gate insulating film using the sidewall insulating layer and the gate electrode layer as masks.

One embodiment of the present invention enables to provide a semiconductor device capable of high-speed response and high-speed operation. Another embodiment of the present invention enables to provide a highly reliable semiconductor device showing stable electric characteristics.

DETAILED DESCRIPTION OF THE INVENTION

Figure 1A:
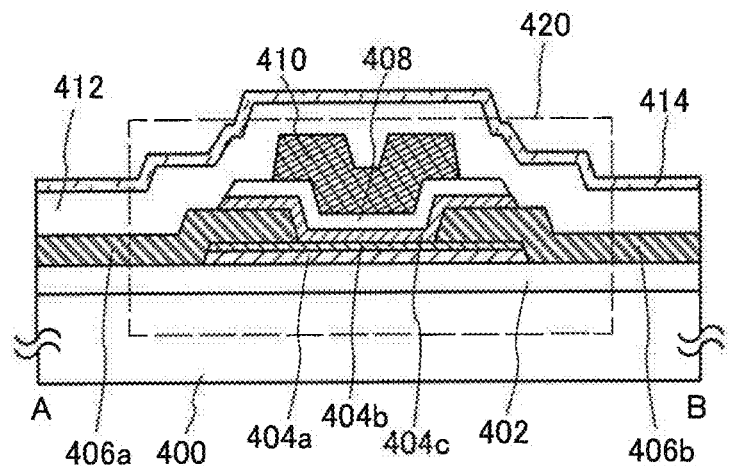
FIGS. 1A and 1B are a cross-sectional view and a top view illustrating a semiconductor device of one embodiment of the present invention.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments.

In embodiments hereinafter described, the same parts are denoted with the same reference numerals throughout the drawings in some cases. Note that the thickness, width, relative positional relation, and the like of components, i.e., a layer, a region, and the like, which are illustrated in the drawings are exaggerated for clarification of descriptions of the embodiments in some cases.

Note that the term "over" in this specification and the like does not necessarily mean that a component is placed "directly on" another component. For example, the expression "a gate electrode layer over an insulating layer" does not exclude the case where there is an additional component between the insulating layer and the gate electrode layer. The same applies to the term "below".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example Therefore, the terms "source" and "drain" can be replaced with each other in this specification.

Note that in this specification and the like, the phrase "electrically connected" includes the case where components are connected through an object having any electric function. There is no particular limitation on an object having any electric function as long as electric signals can be transmitted and received between components that are connected through the object.

Examples of an "object having any electric function" are an electrode and a wiring.

In this specification, the term "parallel" indicates that the angle formed between two straight lines is greater than or equal to −100° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification, the trigonal and rhombohedral crystal systems are included in the hexagonal crystal system.

Embodiment 1

Figure 1B:
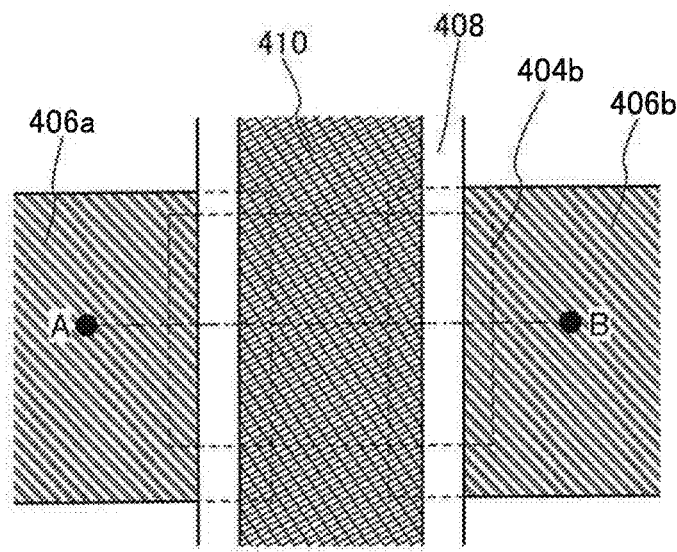

In this embodiment, a semiconductor device of one embodiment of the present invention will be described in detail with reference to drawings. FIGS. 1A and 1B illustrate a semiconductor device of one embodiment of the present invention. FIG. 1B is a top view illustrating the semiconductor device of one embodiment of the present invention, and FIG. 1A is a cross-sectional view taken along the dashed dotted line A-B in FIG. 1B.

A transistor 420 included in the semiconductor device includes a base insulating layer 402 over a substrate 400; a stack of a first oxide layer 404a and an oxide semiconductor layer 404b over the base insulating layer 402; a source electrode layer 406a and a drain electrode layer 406b over the first oxide layer 404a and the oxide semiconductor layer 404b; a second oxide layer 404c over the source electrode layer 406a and the drain electrode layer 406b; a gate insulating layer 408 over the second oxide layer 404c; a gate electrode layer 410 over the gate insulating layer 408; an oxide insulating layer 412 over the source electrode layer 406a, the drain electrode layer 406b, the second oxide layer 404c, the gate insulating layer 408, and the gate electrode layer 410; and an insulating layer 414 over the oxide insulating layer 412.

For the oxide semiconductor layer 404b, oxide having a greater depth from a vacuum level to the bottom of a conduction band than oxides included in the first oxide layer 404a and the second oxide layer 404c is used. A difference in electron affinity between the oxide semiconductor layer 404b and the first oxide layer 404a and a difference in electron affinity between the oxide semiconductor layer 404b and the second oxide layer 404c are each preferably 0.2 eV or higher. With such a structure, a well-shaped structure is formed in which the bottom of the conduction band of the oxide semiconductor layer 404b is lower energy level than the conduction bands of the first oxide layer 404a and the second oxide layer 404c. A channel is formed in the oxide semiconductor layer 404b; thus, a buried channel structure is formed.

To prevent an impurity such as silicon from entering the oxide semiconductor layer 404b serving as a channel, the first oxide layer 404a and the second oxide layer 404c which are in contact with the oxide semiconductor layer 404b do not contain an impurity such as silicon as their main constituent elements. In particular, to suppress interface scattering between the oxide semiconductor layer 404b and the first oxide layer 404a and between the oxide semiconductor layer 404b and the second oxide layer 404c and to reduce trap levels, the first oxide layer 404a, the oxide semiconductor layer 404b, and the second oxide layer 404c preferably contain the same element.

Note that with the structure in which the oxide semiconductor layer 404b is sandwiched between the first oxide layer 404a and the second oxide layer 404c, constituents of the base insulating layer 402 and the gate insulating layer 408 can be prevented from entering the oxide semiconductor layer 404b. For example, in the case where an insulating layer containing silicon (hereinafter also referred to as a silicon insulating layer), such as a silicon oxide film, a silicon oxynitride film, a silicon nitride oxide film, or a silicon nitride film, is used as each of the base insulating layer 402 and the gate insulating layer 408, silicon contained in the base insulating layer 402 and the gate insulating layer 408 can be prevented from entering the oxide semiconductor layer 404b.

Here, silicon oxynitride means the one that contains more oxygen than nitrogen. For example, silicon oxynitride contains at least oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Note that the above ranges are obtained in the case where measurement is performed using Rutherford backscattering spectrometry or hydrogen forward scattering (HFS). In addition, the total of the percentages of the constituent elements does not exceed 100 atomic %.

The first oxide layer 404a and the second oxide layer 404c are preferably thick enough to prevent an impurity element from entering the oxide semiconductor layer 404b. As described in this embodiment, the oxide semiconductor layer 404b is in contact with the source electrode layer 406a and the drain electrode layer 406b, and the second oxide layer 404c is formed over the source electrode layer 406a and the drain electrode layer 406b. Thus, even when the first oxide layer 404a and the second oxide layer 404c are thick, resistance between the oxide semiconductor layer 404b and the source electrode layer 406a and between the oxide semiconductor layer 404b and the drain electrode layer 406b is not increased, so that degradation of on-state characteristics can be suppressed.

Figure 19:
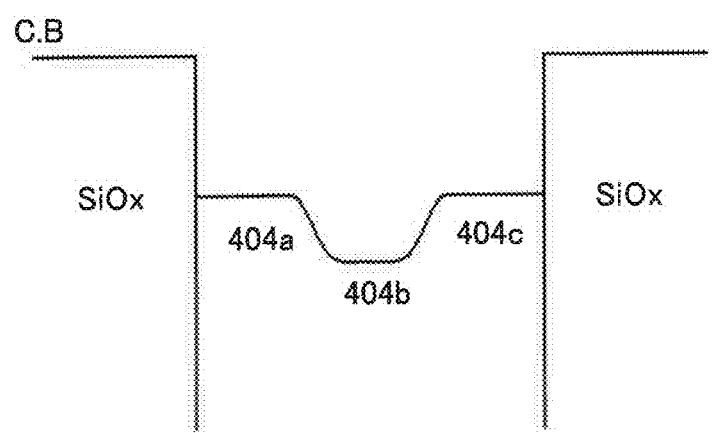
FIG. 19 is a band diagram illustrating a semiconductor device of one embodiment of the present invention.

FIG. 19 illustrates a band structure of a buried channel structure. FIG. 19 is an energy band diagram of the case where an oxide semiconductor layer with an atomic ratio of In:Ga:Zn=1:1:1 is used as each of the first oxide layer 404a and the second oxide layer 404c and an oxide semiconductor layer with an atomic ratio of In:Ga:Zn=3:1:2 is used as the oxide semiconductor layer 404b. The electron affinity of each of the first oxide layer 404a and the second oxide layer 404c is 4.7 eV. The electron affinity of the oxide semiconductor layer 404b is 4.9 eV. The bottoms of the conduction bands of the first oxide layer 404a and the second oxide layer 404c are higher than the bottom of the conduction band of the oxide semiconductor layer 404b. Thus, the band structure of this stacked structure is a well-shaped structure in which the bottom of the conduction band of the oxide semiconductor layer 404b is the deepest, as illustrated in FIG. 19. This band structure shows that a carrier (an electron) moves in the oxide semiconductor layer 404b, that is, a channel formation region of a transistor is substantially formed in the oxide semiconductor layer 404b. As described above, the oxide semiconductor layer 404b is apart from the base insulating layer 402 and the gate insulating layer 408, so that defects due to oxygen vacancies and the like in the oxide semiconductor layer 404b are reduced. Therefore, the carrier (the electron) that moves in the oxide semiconductor layer 404b is less likely to be affected by the defects.

In the band structure in FIG. 19, the channel formation region of the transistor can be regarded to be buried in the oxide semiconductor layer. Since the oxide semiconductor layer 404b serving as the channel formation region is not in contact with the base insulating layer 402 and the gate insulating layer 408, the carrier (the electron) that moves in the channel is less likely to be affected by interface scattering. Also in the case where a state of an interface between the oxide semiconductor layer and the insulating layer is changed with time (in the case where an interface state is formed), the carrier (the electron) that moves in the channel is less likely to be affected by the interface, which leads to a highly reliable semiconductor device.

The oxide insulating layer 412 preferably contains oxygen in excess of the stoichiometric composition, in which case, the oxide insulating layer 412 can supply oxygen to the oxide semiconductor layer 404b, so that oxygen vacancies can be reduced. For example, in the case where a silicon oxide film is used as the oxide insulating layer 412, the composition formula is $SiO_{(2+\alpha)}$ ($\alpha>0$).

When the oxide insulating layer 412 meets such conditions, part of oxygen in the oxide insulating layer 412 is released and supplied to the oxide semiconductor layer 404b by heat treatment, so that oxygen vacancies in the oxide semiconductor layer 404b are filled; thus, a shift of threshold voltage of the transistor in the negative direction can be suppressed. The release of oxygen by heat treatment can be verified by thermal desorption spectroscopy (TDS). The amount of oxygen released from the oxide insulating layer 412, which is converted into oxygen atoms in TDS is $1.0 \times 10^{19}$ atoms/cm$^3$ or more, preferably $3.0 \times 10^{19}$ atoms/cm$^3$ or more, more preferably $1.0 \times 10^{20}$ atoms/cm$^3$ or more.

End portions of the second oxide layer 404c and end portions of the gate insulating layer 408 overlap with the source electrode layer 406a and the drain electrode layer 406b. Side surfaces of the second oxide layer 404c and side surfaces of the gate insulating layer 408 are in contact with the oxide insulating layer 412. With such a structure, through the second oxide layer 404c, the gate insulating layer 408, or both, oxygen can be supplied from the oxide insulating layer 412 to the oxide semiconductor layer 404b; thus, oxygen vacancies can be filled. To prevent short circuit between the gate electrode layer 410 and the source electrode layer 406a or between the gate electrode layer 410 and the drain electrode layer 406b, it is preferable that each of the second oxide layer 404c and the gate insulating layer 408 be extended to 0 μm to 3 μm, preferably 0 μm to 1 μm from the gate electrode layer 410 in the channel length direction.

When hydrogen is contained in the oxide semiconductor layer 404b, it can work as a donor and form an n-type region. To prevent entry of hydrogen from the outside of the transistor 420 to the oxide semiconductor layer 404b, the insulating layer 414 is preferably formed above or below the oxide semiconductor layer 404b as a protection layer.

Next, a method for fabricating the transistor 420 will be described.

First, the base insulating layer 402 is formed over the substrate 400.

There is no particular limitation on a substrate that can be used, as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 400. Alternatively, an SOI substrate, a semiconductor substrate over which a semiconductor element is provided, or the like can be used.

The base insulating layer 402 can be formed by a sputtering method, a molecular beam epitaxy (MBE) method, a chemical vapor deposition (CVD) method, a pulsed laser deposition (PLD) method, an atomic layer deposition (ALD) method, or the like, as appropriate.

The base insulating layer 402 can be formed using an inorganic insulating film. It is preferable to use, for example, a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, or an aluminum nitride oxide film. Furthermore, the base insulating layer 402 can be formed with a single-layer structure or a stacked-layer structure including two or more layers with the use of these compounds.

As the base insulating layer 402, a silicon oxide film or a silicon oxynitride film may be formed under the following conditions: a vacuum-evacuated treatment chamber in a plasma CVD apparatus is held at a temperature higher than or equal to 180° C. and lower than or equal to 450° C., preferably higher than or equal to 180° C. and lower than or equal to 350° C.; a source gas is introduced into the treatment chamber to set the pressure in the treatment chamber to higher than or equal to 100 Pa and lower than or equal to 250 Pa, preferably higher than or equal to 100 Pa and lower than or equal to 200 Pa; and the high-frequency power supplied to an electrode provided in the treatment chamber is greater than or equal to 1.48 W/cm$^2$ and less than or equal to 2.46 W/cm$^2$, preferably greater than or equal to 1.48 W/cm$^2$ and less than or equal to 1.97 W/cm$^2$.

As the source gas, a deposition gas containing silicon and an oxidation gas are preferably used. Typical examples of the deposition gas containing silicon include silane, disilane, trisilane, and silane fluoride. Examples of the oxidation gas include oxygen, ozone, dinitrogen monoxide, nitrogen dioxide, and dry air.

As the deposition condition, the high-frequency power with the above power density is supplied in the treatment chamber under the above pressure, whereby the decomposition efficiency of the source gas in plasma is promoted, oxygen radicals are increased, and oxidation of the deposition gas containing silicon is promoted; thus, the amount of oxygen contained in the base insulating layer 402 exceeds the stoichiometric composition. However, in the case where the substrate temperature is within a range of the temperature in the chamber, the bond between silicon and oxygen is weak. As a result, an oxide insulating layer which contains oxygen in excess of the stoichiometric composition and from which part of oxygen is released by heating can be formed.

In the source gas of the base insulating layer 402, the ratio of the deposition gas containing silicon to the oxidation gas is increased, and the high-frequency power is set to have the above power density. Thus, the deposition rate can be increased, and the amount of oxygen contained in the base insulating layer 402 can be increased.

Note that the base insulating layer 402 is not necessarily provided as long as insulation between the substrate 400 and the oxide semiconductor layer 404b to be formed later can be ensured.

Figure 2A:
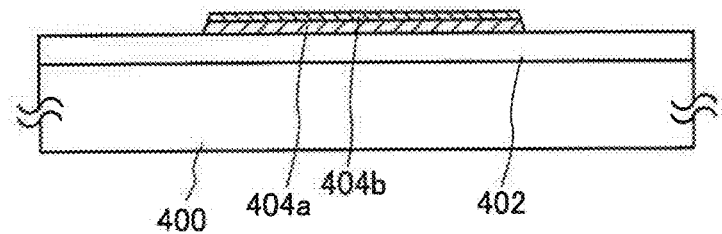
FIGS. 2A to 2D are cross-sectional views illustrating a method for fabricating a semiconductor device of one embodiment of the present invention.

Next, the first oxide layer 404a and the oxide semiconductor layer 404b are formed over the base insulating layer 402 (see FIG. 2A). The first oxide layer 404a and the oxide semiconductor layer 404b can be formed in the following manner; oxide films are stacked and subjected to heat treatment, and the oxide films are selectively etched using a mask.

The first oxide layer 404a may be an oxide layer that exhibits an insulating property or an oxide layer (an oxide semiconductor layer) that exhibits semiconductor characteristics. An oxide semiconductor is used for the oxide semiconductor layer 404b. Note that materials of the first oxide layer 404a and the oxide semiconductor layer 404b are selected such that the electron affinity of the first oxide layer 404a is lower than that of the oxide semiconductor layer 404b by 0.2 eV or more.

Oxides which contain the same element as their main constituent elements are used for the first oxide layer 404a and the oxide semiconductor layer 404b, so that interface scattering between the first oxide layer 404a and the oxide semiconductor layer 404b can be suppressed; thus, a transistor with high mobility can be provided. In addition, the use of oxides which contain the same element as their main constituent elements for the first oxide layer 404a and the oxide semiconductor layer 404b can reduce trap levels and variations in threshold voltage of a transistor due to change with time or a stress test.

Examples of oxide insulators that can be used for the first oxide layer 404a are hafnium oxide, tantalum oxide, gallium oxide, aluminum oxide, magnesium oxide, and zirconium oxide. The use of such an oxide insulator that does not contain silicon can prevent an impurity such as silicon from entering the oxide semiconductor layer 404b.

An oxide semiconductor that can be used for the first oxide layer 404a and the oxide semiconductor layer 404b preferably contains at least indium (In) or zinc (Zn). Alternatively, the oxide semiconductor preferably contains both In and Zn. To suppress change in electrical characteristics of the transistor including the oxide semiconductor, the oxide semiconductor preferably contains one or more of stabilizers in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

For the above-listed oxides, an In—Ga—Zn oxide, for example, is an oxide whose main constituent elements are In, Ga, and Zn, and there is no particular limitation on the ratio of In:Ga:Zn. The In—Ga—Zn oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

Note that materials of the first oxide layer 404a and the oxide semiconductor layer 404b are selected such that the electron affinity of the oxide semiconductor layer 404b is higher than that of the first oxide layer 404a by 0.2 eV or more. With the selection of materials in this manner, the depth of the conduction band of the oxide semiconductor layer 404b from the vacuum level is greater than the depth of the conduction band of the first oxide layer 404a from the vacuum level, so that the well-shaped structure can be formed.

An oxide used for the first oxide layer 404a contains aluminum, gallium, germanium, yttrium, tin, lanthanum, or cerium such that the proportion of the element in the first oxide layer 404a is higher than that in the oxide semiconductor layer 404b. Specifically, the content of any of the above elements in the oxide used for the first oxide layer 404a is more than or equal to 1.5 times, preferably more than 2 times, further preferably more than 3 times as high as that in the oxide used for the oxide semiconductor layer 404b. Any of the above elements strongly bonds to oxygen and high energy is needed for forming an oxygen vacancy, so that an oxygen vacancy is less likely to occur. For this reason, an oxygen vacancy is less likely to occur in the first oxide layer 404a that contains the element whose proportion is higher than the proportion of the element in the oxide semiconductor layer 404b. This indicates that the first oxide layer 404a has stable characteristics. Thus, the proportion of the element in the first oxide layer 404a is set high, so that a stable interface with the silicon insulating layer can be formed, which leads to a highly reliable semiconductor device.

Note that when the first oxide layer 404a contains a material represented by $InGa_XZn_YO_Z$, it is preferable that X do not exceed 10. An increase in the proportion of gallium in the oxide semiconductor layer increases the amount of powder substances (also referred to as dust) generated in the film formation by RF sputtering, which leads to deterioration in characteristics of a semiconductor device in some cases.

Note that the oxide semiconductor film can be formed by, instead of an RF sputtering method in which a high-frequency power source is used as a sputtering power source, a DC sputtering method in which a direct-current power source is used, an AC sputtering method in which an alternating-current power source, or the like. In particular, by a DC sputtering method, dust generated in the film formation can be reduced and the film thickness can be uniform.

In the case where an In—Ga—Zn oxide is used for the first oxide layer 404a and the oxide semiconductor layer 404b, oxide with an atomic ratio of In:Ga:Zn=1:1:1, 2:2:1, 3:1:2, 1:3:2, 1:4:3, 1:5:4, 1:6:6, 2:1:3, 1:6:4, 1:9:6, 1:1:4, or 1:1:2 or oxide whose atomic ratio is in the neighborhood of any of the above atomic ratios may be used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content in the oxide semiconductor layer 404b is preferably higher than that in the first oxide layer 404a. In an oxide semiconductor, the s orbital of heavy metal mainly contributes to carrier transfer, and when the proportion of In in the oxide semiconductor is increased, overlap of the s orbitals is likely to be increased. Therefore, oxide having a composition in which the proportion of In is higher than that of Ga has higher mobility than oxide having a composition in which the proportion of In is equal to or lower than that of Ga. Thus, with use of an oxide having a high indium content for the oxide semiconductor layer 404b, high mobility can be achieved.

When the atomic ratio in the first oxide layer 404a is expressed that $In:Ga:Zn=x_1:y_1:z_1$ and the atomic ratio in the oxide semiconductor layer 404b is expressed that $In:Ga:Zn=x_2:y_2:z_2$, the first oxide layer 404a and the oxide semiconductor layer 404b are formed such that $y_1/x_1$ is larger than $y_2/x_2$, preferably more than or equal to 1.5 times as large as $y_2/x_2$, more preferably more than 2 times as large as $y_2/x_2$, still more preferably more than 3 times as large as $y_2/x_2$.

The oxide semiconductor layer is substantially intrinsic. Note that a substantially intrinsic oxide semiconductor layer means an oxide semiconductor layer with a carrier density of $1\times10^{17}/cm^3$ or lower, preferably $1\times10^{16}/cm^3$ or lower, more preferably $1\times10^{15}/cm^3$ or lower, further preferably $1\times10^{14}/cm^3$ or lower, still further preferably $1\times10^{13}/cm^3$ or lower.

Hydrogen contained in the oxide semiconductor reacts with oxygen bonded to metal atom to produce water, and a defect is formed in a lattice (or a portion) from which oxygen is released. In addition, a bond of oxygen and a part of hydrogen causes generation of electrons serving as carriers. Thus, the impurities containing hydrogen are reduced as much as possible in the step of forming the oxide semiconductor layer, whereby the hydrogen concentration in the oxide semiconductor layer can be reduced. When the oxide semiconductor layer which is highly purified by removing hydrogen as much as possible is used as the channel formation region, a shift of the threshold voltage in the negative direction can be suppressed, and the leakage current between a source and a drain of the transistor (typically, the off-state current or the like) can be decreased to several yoctoamperes per micrometer to several zeptoamperes per micrometer. As a result, electric characteristics of the transistor can be improved.

When a transistor including an oxide semiconductor film is off, the drain current is $1\times10^{-18}$ A or lower, preferably $1\times10^{-21}$ A or lower, more preferably $1\times10^{-24}$ A or lower at room temperature (about 25° C.), or $1\times10^{-15}$ A or lower, preferably $1\times10^{-18}$ A or lower, more preferably $1\times10^{-21}$ A or lower at 85° C. Note that an off state of an n-channel transistor refers to a state where the gate voltage is sufficiently lower than the threshold voltage. Specifically, when the gate voltage is lower than the threshold voltage by 1 V or more, preferably 2 V or more, more preferably 3 V or more, the transistor is turned off.

For the formation of the oxide semiconductor film, a rare gas (typically argon) atmosphere, an oxygen atmosphere, or a mixed gas atmosphere of a rare gas and oxygen is used as appropriate. In the case of using the mixed gas atmosphere of a rare gas and oxygen, the proportion of oxygen is preferably higher than that of a rare gas. The target for forming the oxide semiconductor film may be selected as appropriate in accordance with the composition of the oxide semiconductor film to be formed.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

Note that the first oxide layer 404a, the oxide semiconductor layer 404b, and the second oxide layer 404c may have different crystallinities. In other words, a single crystal oxide film, a polycrystalline oxide film, an amorphous oxide film, and the like may be combined as appropriate.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

With the use of the CAAC-OS film in a transistor, change in the electrical characteristics of the transistor due to irradiation with visible light or ultraviolet light is small.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used. By increasing the substrate heating temperature during the deposition, migration of a sputtered particle occurs after the sputtered particle reaches a substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the flat-plate-like sputtered particle is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film In such a case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film for a shorter time.

The CAAC-OS film may be formed in the following manner.

First, the first oxide semiconductor film is formed to a thickness of greater than or equal to 1 nm and less than 10 nm by a sputtering method. Specifically, the substrate temperature is set to higher than or equal to 100° C. and lower than or equal to 500° C., preferably higher than or equal to 150° C. and lower than or equal to 450° C., and the percentage of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Then, the second oxide semiconductor film having the same composition as the first oxide semiconductor film is formed to a thickness of greater than or equal to 10 nm and less than or equal to 50 nm by a sputtering method. Specifically, the substrate temperature is set to higher than or equal to 100° C. and lower than or equal to 500° C., preferably higher than or equal to 150° C. and lower than or equal to 450° C., and the percentage of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness of greater than or equal to 10 nm can be formed.

When silicon that is one of Group 14 elements is contained in the oxide semiconductor layer 404$b$ where a channel is formed, problems such as a decrease in the crystallinity of the oxide semiconductor layer 404$b$, difficulty in forming a CAAC-OS film, and a decrease in carrier mobility occur. For this reason, the concentration of silicon contained in the oxide semiconductor layer 404$b$ is preferably reduced. By setting the concentration of silicon contained in the oxide semiconductor layer 404$b$ to $2.5 \times 10^{21}$ atoms/cm$^3$ or less, preferably $4.0 \times 10^{19}$ atoms/cm$^3$ or less, a reduction in the crystallinity of the oxide semiconductor layer 404$b$ can be suppressed. Furthermore, by setting the concentration of silicon to $1.4 \times 10^{21}$ atoms/cm$^3$ or less, a reduction in carrier mobility can be suppressed. Moreover, by setting the concentration of silicon to $2.0 \times 10^{19}$ atoms/cm$^3$ or less, an oxygen vacancy in the oxide semiconductor layer 404$b$ can be reduced, which leads to an increase in reliability.

To prevent silicon from entering the oxide semiconductor layer 404$b$, the first oxide layer 404$a$ and the second oxide layer 404$c$ which are in contact with the oxide semiconductor layer 404$b$ do not contain an impurity such as silicon as their main constituent elements. The first oxide layer 404$a$ and the second oxide layer 404$c$ each function as a protection film that prevents entry of an impurity element such as silicon to the oxide semiconductor layer 404$b$ from the base insulating layer 402 and the gate insulating layer 408.

An impurity such as silicon enters the first oxide layer 404$a$ and the second oxide layer 404$c$, a silicon-mixed region is formed at an interface between the base insulating layer 402 and the first oxide layer 404$a$ and/or an interface between the gate insulating layer 408 and the second oxide layer 404$c$ in some cases. To prevent the silicon-mixed region from affecting the oxide semiconductor layer 404$b$ and to prevent silicon from entering the oxide semiconductor layer 404$b$, each of the first oxide layer 404$a$ and the second oxide layer 404$c$ preferably has a sufficient thickness.

Figure 20:
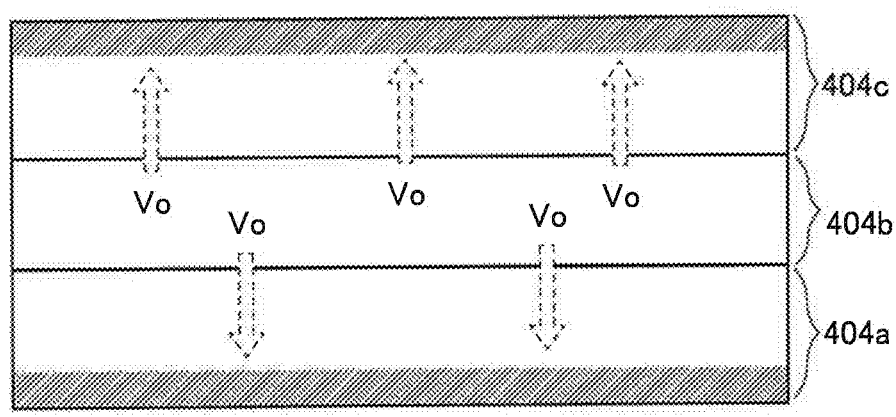
FIG. 20 illustrates diffusion of oxygen vacancies.

In the silicon-mixed region, oxygen in the oxide layer bonds to silicon, so that the crystallinity of the oxide layer is decreased and an oxygen vacancy is likely to be formed. For this reason, oxygen vacancies in the oxide semiconductor layer 404$b$ are diffused to the silicon-mixed region to be trapped (gettering) in the silicon-mixed region in some cases. FIG. 20 schematically illustrates this phenomenon. In FIG. 20, a diagonally shaded region indicates a region where silicon enters, and $V_O$ denotes an oxygen vacancy. Note that here, the expression "oxygen vacancies are diffused" means a phenomenon in which an oxygen atom near an oxygen vacancy fills the oxygen vacancy, and the site of the oxygen atom becomes a new oxygen vacancy, so that oxygen vacancies seem to transfer.

An oxygen vacancy trapped in the silicon-mixed region bonds to oxygen supplied from the insulating layer 402 and the gate insulating layer 408. Therefore, oxygen vacancies in the first oxide layer 404$a$ and the second oxide layer 404$c$ are not increased.

Oxygen vacancies in the oxide semiconductor layer 404$b$ are diffused and trapped in the silicon-mixed region as described above, so that oxygen vacancies formed in the oxide semiconductor layer 404$b$, which are apart from the base insulating layer 402 and the gate insulating layer 408, can be reduced.

In this embodiment, the first oxide layer 404$a$ having an amorphous structure is formed under the conditions that the substrate temperature is set to room temperature and a target having an atomic ratio of In:Ga:Zn=1:3:2 is used. The thickness of the first oxide layer 404$a$ having an amorphous structure is set to greater than or equal to 1 nm and less than or equal to 50 nm, preferably greater than or equal to 20 nm and less than or equal to 40 nm. An increase in the thickness of the first oxide layer 404$a$ can avoid entry of a constituent of the base insulating layer 402 to the oxide semiconductor layer 404$b$. For example, when the base insulating layer 402 is formed with silicon oxide, silicon can be prevented from entering the oxide semiconductor layer 404$b$.

Further, the oxide semiconductor layer 404$b$ is formed under the conditions that the substrate temperature is set to 400° C. and a target having an atomic ratio of In:Ga:Zn=1:1:1 is used. The oxide semiconductor layer 404$b$ is a film containing a crystal whose c-axis is aligned in a direction approximately perpendicular to a surface, preferably a CAAC-OS film. The oxide semiconductor layer 404$b$ has a thickness greater than or equal to 1 nm and less than or equal to 40 nm, preferably greater than or equal to 5 nm and less than or equal to 20 nm. The film formation temperature of the oxide semiconductor layer 404$b$ is higher than or equal to 400° C. and lower than or equal to 550° C., preferably higher than or equal to 450° C. and lower than or equal to 500° C. Note that the film formation is performed at temperatures that the wiring layers already formed can withstand.

The heat treatment after the film formation of the oxide layer is performed under reduced pressure in an atmosphere of nitrogen, oxygen, or nitrogen and oxygen at a temperature higher than or equal to 150° C. and lower than the strain point of the substrate, preferably higher than or equal to 250° C. and lower than or equal to 450° C., further preferably higher than or equal to 300° C. and lower than or equal to 450° C. By the heat treatment, excess hydrogen (including water or a hydroxyl group) in the oxide layer is removed (dehydration or dehydrogenation). Further, a high-purity oxygen gas or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature after the termination of the heat treatment is maintained or slow cooling is performed to lower the temperature from the heating temperature. By the effect of the oxygen gas, oxygen which is a main constituent element of the oxide and which has been reduced at the same time as the step for removing impurities by dehydration or dehydrogenation is supplied.

The heat treatment is performed after the oxide semiconductor layer 404b is formed, whereby the hydrogen concentration in the oxide semiconductor layer 404b can be lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours. The number of times of the heat treatment performed on the oxide layer is not limited, and the timing of the heat treatment is not limited.

Next, a conductive film to be the source electrode layer 406a and the drain electrode layer 406b is formed over the oxide semiconductor layer 404b. The conductive film may be formed using a metal material such as molybdenum, titanium, tantalum, tungsten, aluminum, copper, chromium, neodymium, or scandium, or an alloy material containing any of these materials as its main constituent element by a plasma CVD method, a sputtering method, or the like. The conductive film may also be formed using a conductive material such as indium tin oxide, indium oxide containing tungsten oxide, indium zinc oxide containing tungsten oxide, indium oxide containing titanium oxide, indium tin oxide containing titanium oxide, or indium zinc oxide. It is also possible that the conductive film has a stacked-layer structure of the above conductive material and the above metal material.

Figure 2B:
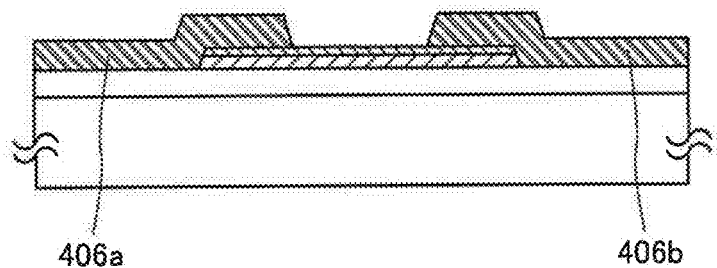

The formed conductive film is etched, so that the source electrode layer 406a and the drain electrode layer 406b can be formed (see FIG. 2B). Note that in etching for forming the source electrode layer 406a and the drain electrode layer 406b, a region of the oxide semiconductor layer 404b which is located between the source electrode layer 406a and the drain electrode layer 406b is also etched concurrently and is reduced in thickness in some cases. Thus, in some cases, the region of the oxide semiconductor layer 404b which does not overlap with the source electrode layer and the drain electrode layer is thinner than the region overlapping with them.

Figure 2C:
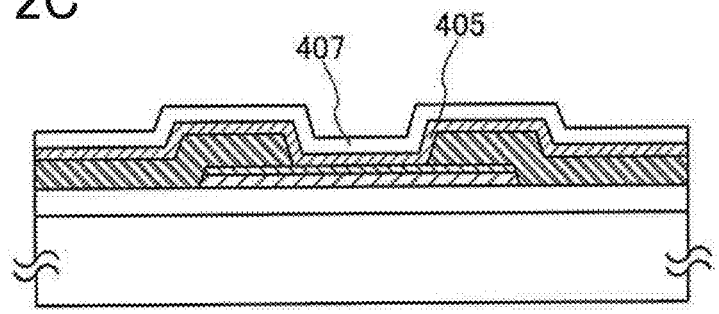

Then, an oxide film 405 to be the second oxide layer 404c and a gate insulating film 407 to be the gate insulating layer 408 are stacked over the source electrode layer 406a and the drain electrode layer 406b (see FIG. 2C).

A material and a method for the oxide film 405 can be similar to those for the first oxide layer 404a. Note that the thickness of the oxide film 405 is preferably smaller than that of the first oxide layer 404a and larger than that of the oxide semiconductor layer 404b. Since the oxide film 405 overlaps with the oxide semiconductor layer 404b that has a crystalline structure, crystal growth occurs using a crystal of the oxide semiconductor layer 404b as a seed crystal; thus, the oxide film 405 readily has a crystalline structure. For this reason, even when the oxide film 405 is formed using a material and a method similar to those for the first oxide layer 404a, the crystalline structure of the oxide film 405 differs from that of the first oxide layer 404a, and a film having high crystallinity might be formed as the second oxide layer 404c. Note that the crystallinity of the second oxide layer 404c is lower than that of the oxide semiconductor layer 404b. A region in the second oxide layer 404c which is in contact with the oxide semiconductor layer 404b has different crystallinity from a region in the second oxide layer 404c which is not in contact with the oxide semiconductor layer 404b in some cases.

An interface between the oxide semiconductor layer 404b and the second oxide layer 404c may be unclear. In such a case, interface scattering between the oxide semiconductor layer 404b and the second oxide layer 404c is reduced.

Part of the second oxide layer 404c, that is, a region which is in contact with the source electrode layer 406a and the drain electrode layer 406b and is not in contact with the oxide semiconductor layer 404b, readily becomes amorphous. The thickness of the second oxide layer 404c is greater than or equal to 1 nm and less than or equal to 40 nm, preferably greater than or equal to 5 nm and less than or equal to 30 nm. An increase in the thickness of the second oxide layer 404c can avoid entry of a constituent of the gate insulating layer 408 to the oxide semiconductor layer 404b. In particular, in the case where silicon oxide is used for the gate insulating layer, entry of silicon to the oxide semiconductor layer 404b can be prevented. Since the second oxide layer 404c is provided over the source electrode layer 406a and the drain electrode layer 406b, the thickness of the second oxide layer 404c can be increased without an increase in resistance between the oxide semiconductor layer 404b and the source electrode layer 406a and between the oxide semiconductor layer 404b and the drain electrode layer 406b.

A material and a method for the gate insulating layer 408 can be similar to those for the base insulating layer 402.

Figure 2D:
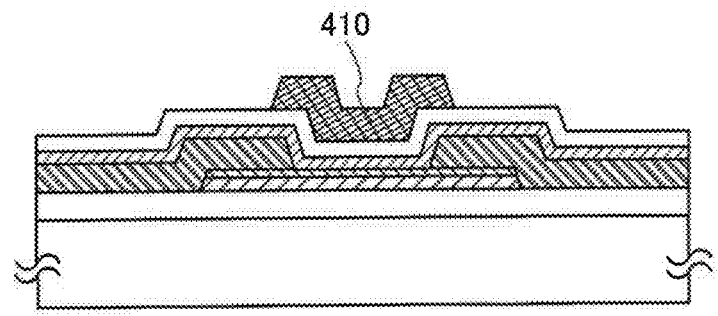

Next, the gate electrode layer 410 is formed over the gate insulating film 407 (see FIG. 2D). A material and a method for the gate electrode layer 410 can be similar to those for the source electrode layer 406a and the drain electrode layer 406b.

The gate electrode layer 410 overlaps with the source electrode layer 406a and the drain electrode layer 406b. With such a structure, a high electric field in the vicinity of the drain electrode layer 406b is relaxed, so that on-state characteristics of the transistor 420 can be improved.

Figure 3A:
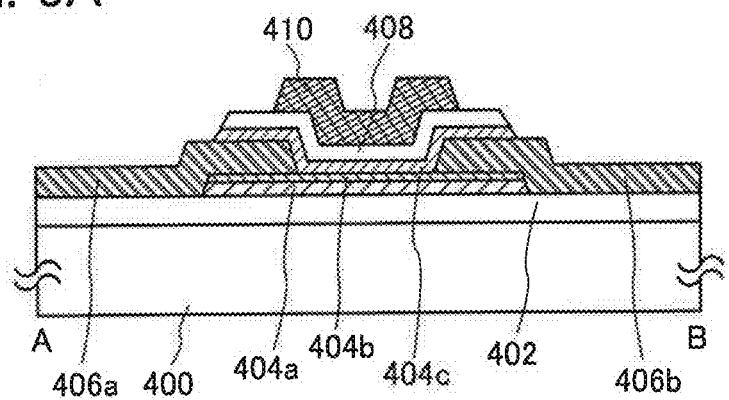
FIGS. 3A and 3B are cross-sectional views illustrating a method for fabricating a semiconductor device of one embodiment of the present invention.

Next, the oxide film 405 and the gate insulating film 407 are selectively etched using a mask to form the second oxide layer 404c and the gate insulating layer 408 (see FIG. 3A).

End portions of the second oxide layer 404c and end portions of the gate insulating layer 408 overlap with the source electrode layer 406a and the drain electrode layer 406b, and side surfaces of the second oxide layer 404c and side surfaces of the gate insulating layer 408 are in contact with the oxide insulating layer 412 to be formed later. The second oxide layer 404c and the gate insulating layer 408 are partly etched and removed, so that oxygen released from the oxide insulating layer 412 can be supplied to the oxide semiconductor layer 404b through the second oxide layer 404c, the gate insulating layer 408, or both.

The etching of the second oxide layer 404c and the gate insulating layer 408 may be performed before the formation of the gate electrode layer 410. As the etching mask used in this step, the mask used in the etching of the first oxide layer 404a and the oxide semiconductor layer 404b may be used. The reuse of the mask can reduce the number of masks.

Next, the oxide insulating layer 412 is formed over the gate electrode layer 410. A material and a method for the oxide insulating layer 412 can be similar to those for the base insulating layer 402. The oxide insulating layer 412 may be formed using an oxide insulating layer such as a silicon oxide film, a silicon oxynitride film, an aluminum oxide film, an aluminum oxynitride film, a hafnium oxide film, or a gallium oxide film, or an oxide insulating layer containing nitrogen. The oxide insulating layer 412 preferably contains excessive oxygen so as to supply oxygen to the oxide semiconductor layer 404b.

As a film capable of supplying oxygen, the oxide insulating layer 412 is preferably formed in a manner similar to that of the base insulating layer 402; the high-frequency power with high power density is supplied in a plasma CVD apparatus that is vacuum-evacuated, so that the film contains excessive oxygen and readily releases oxygen.

Oxygen may be added to the oxide insulating layer 412 by an ion implantation method, an ion doping method, a plasma immersion ion implantation method, or the like. By the addition of oxygen, excess oxygen can be contained in the oxide insulating layer 412 and oxygen can be supplied from the oxide insulating layer 412 to the oxide semiconductor layer 404b.

After the formation of the oxide insulating layer 412, heat treatment is performed. The oxide semiconductor layer 404b includes oxygen vacancies formed by damage due to etching or plasma which is performed after the formation of the oxide semiconductor layer 404b.

Accordingly, by performing heat treatment in this step, oxygen is supplied to the oxide semiconductor layer 404b and oxygen vacancies are reduced; thus, damage given after the formation of the oxide semiconductor layer 404b is repaired. The temperature of the heat treatment is typically higher than or equal to 200° C. and lower than or equal to 450° C. The heat treatment allows oxygen contained in the oxide insulating layer 412 to be released.

For example, heat treatment is performed in a mixed atmosphere of nitrogen and oxygen at 350° C. for one hour. By the heat treatment, hydrogen atoms and oxygen atoms contained in the oxide semiconductor layer 404b are released from the oxide semiconductor layer 404b. In the oxide semiconductor layer 404b, sites from which oxygen atoms are released become oxygen vacancies. However, oxygen atoms contained in the oxide insulating layer, which are in excess of the stoichiometric composition, move to the sites of the oxygen vacancies, and the oxygen vacancies are filled with the oxygen atoms.

In this manner, nitrogen, hydrogen, or water is released from the oxide semiconductor layer 404b by the heat treatment performed after the formation of the oxide insulating layer 412, whereby the proportion of nitrogen, hydrogen, or water in the film can be reduced to about a tenth.

The insulating layer 414 is formed over the oxide insulating layer 412. The insulating layer 414 may be formed using a film containing silicon nitride, aluminum oxide, aluminum oxynitride, gallium oxide, gallium oxynitride, yttrium oxide, yttrium oxynitride, hafnium oxide, hafnium oxynitride, or the like. The insulating layer 414 can inhibit entry of an impurity from the top of the semiconductor device to the oxide semiconductor layer 404b or can inhibit release of oxygen in the oxide insulating layer 412 to the top of the semiconductor device.

Figure 3B:
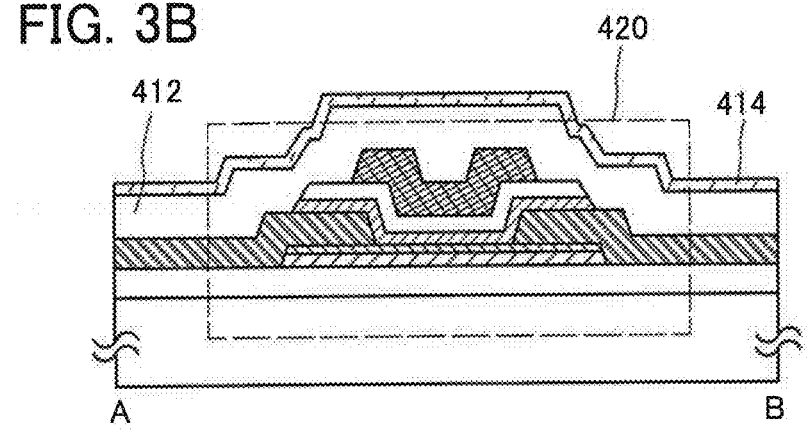

By the aforementioned process, the semiconductor device can be fabricated (see FIG. 3B).

In the semiconductor device described in this embodiment, the first oxide layer is formed between the oxide semiconductor layer where a channel is formed and the base insulating layer, and the second oxide layer is formed between the oxide semiconductor layer and the gate insulating layer. An impurity element such as silicon is prevented from entering the oxide semiconductor layer from the base insulating layer and the gate insulating layer. Thus, change in characteristics of the transistor is suppressed, thereby achieving a highly reliable semiconductor device.

With the structure where the source electrode layer 406a and the drain electrode layer 406b are formed in contact with the oxide semiconductor layer 404b and the second oxide layer 404c is formed over the source electrode layer 406a and the drain electrode layer 406b, the thicknesses of the first oxide layer and the second oxide layer can be increased without a reduction in contact resistance between the oxide semiconductor layer 404b and the source electrode layer 406a and between the oxide semiconductor layer 404b and the drain electrode layer 406b. Such an increase in thicknesses of the first oxide layer and the second oxide layer can inhibit entry of an impurity to the oxide semiconductor layer, which leads to stable transistor characteristics.

Furthermore, owing to the second oxide layer 404c and the gate insulating layer 408 which are formed by selective etching of the oxide film 405 and the gate insulating film 407, oxygen can be supplied from the oxide insulating layer 412 formed over the second oxide layer 404c and the gate insulating layer 408 to the oxide semiconductor layer 404b. By the supply of oxygen to the oxide semiconductor layer 404b, oxygen vacancies are filled, so that transistor characteristics are stabilized, thereby providing a highly reliable semiconductor device.

Figure 4A:
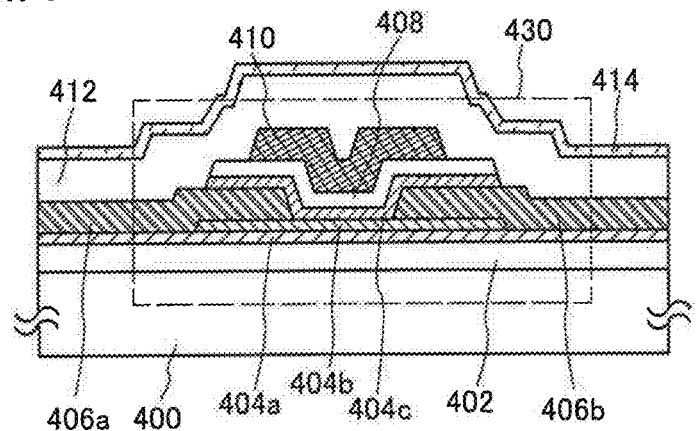
FIGS. 4A to 4C are cross-sectional views each illustrating a semiconductor device of one embodiment of the present invention.

The structure of the transistor described in this embodiment is not limited to the above structure. For example, as in a transistor 430 illustrated in FIG. 4A, the first oxide layer 404a and the oxide semiconductor layer 404b may have different shapes. In the transistor 430, the first oxide layer 404a in a region where the oxide semiconductor layer 404b is not provided is in contact with the source electrode layer 406a and the drain electrode layer 406b. With this structure, the thickness of the first oxide layer 404a can be increased without fabricating the step coverage of the source electrode layer 406a and the drain electrode layer 406b poor, and entry of an impurity element to the oxide semiconductor layer 404b can be inhibited.

Figure 4B:
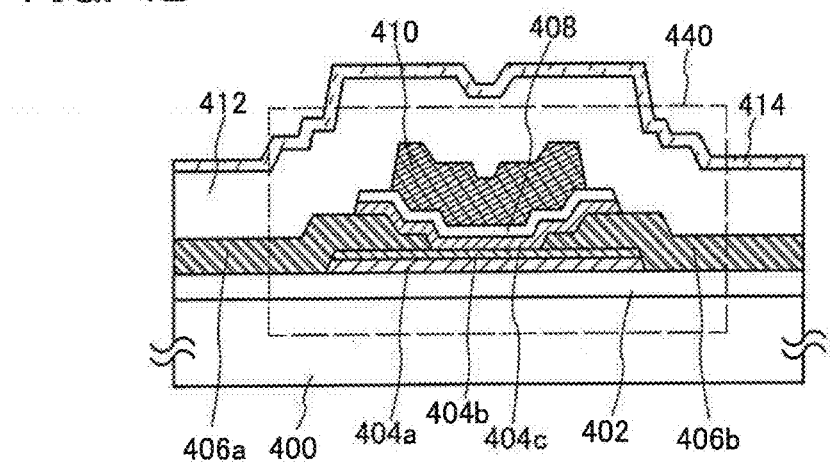

Alternatively, as in a transistor 440 illustrated in FIG. 4B, a periphery portion of the source electrode layer 406a and a periphery portion of the drain electrode layer 406b which overlap with the gate electrode layer 410 may have a stepped shape. The periphery portion having a stepped shape can be formed by a plurality of etching steps (etching involving a reduction (downsizing) in resist mask and etching using the downsized resist mask). With the stepped shapes of the periphery portions of the source electrode layer 406a and the drain electrode layer 406b, the step coverate of the second oxide layer 404c can be improved.

Figure 4C:
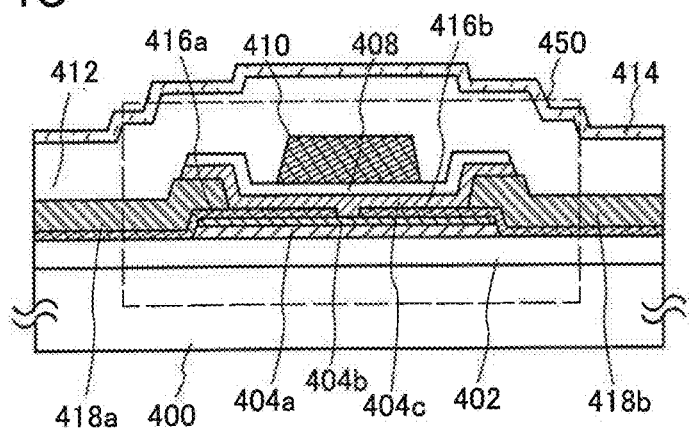

Further alternatively, as in a transistor 450 illustrated in FIG. 4C, the source electrode layer and the drain electrode layer may have a two-layer structure. The transistor 450 illustrated in FIG. 4C includes a first source electrode layer 416a and a first drain electrode layer 416b which determine the channel length, and a second source electrode layer 418a and a second drain electrode layer 418b, which reduce the whole resistance of the source electrode layer and the drain electrode layer and are provided over the first source electrode layer 416a and the first drain electrode layer 416b.

The distance between the first source electrode layer 416a and the first drain electrode layer 416b corresponds to the channel length of the transistor 450. In the case where the channel length of the transistor 450 is less than 50 nm, preferably less than 30 nm, a developed mask which is obtained by exposing a resist with use of an electron beam is preferably used as an etching mask, for example. At this time, in an electron beam writing apparatus capable of electron beam irradiation, it is preferable that the minimum beam size be set to 2 nm or less and that irradiation be performed.

The thickness of a mask that can be formed by an electron beam is small. For this reason, the first source electrode layer 416a and the first drain electrode layer 416b are preferably formed to have a small thickness in consideration of the coverage of the resist functioning as the mask. However, a reduction in the thickness of the first source electrode layer 416a and the first drain electrode layer 416b makes the resistance high. Accordingly, to reduce the resistance, it is preferable to form the second source electrode layer 418a and the second drain electrode layer 418b which can have a large thickness.

Figure 5A:
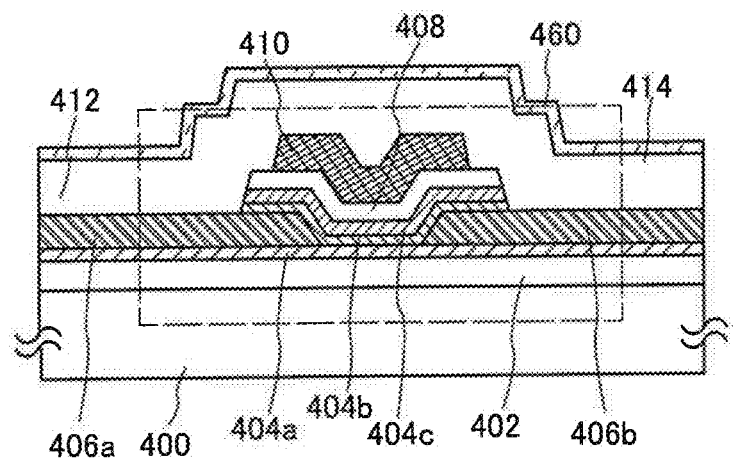
FIGS. 5A and 5B are cross-sectional views each illustrating a semiconductor device of one embodiment of the present invention.
Figure 5B:
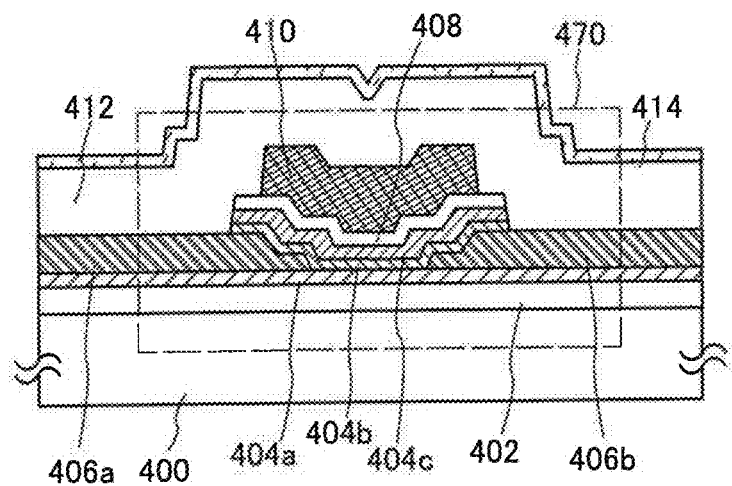

Still further alternatively, the following structure may be employed: the source electrode layer 406a and the drain electrode layer 406b are formed over and in contact with the first oxide layer 404a, and the oxide semiconductor layer 404b is formed over and in contact with the source electrode layer 406a and the drain electrode layer 406b, as in FIGS. 5A and 5B. Over the oxide semiconductor layer 404b, the second oxide layer 404c and the gate insulating layer 408 are stacked.

In a transistor 460 illustrated in FIG. 5A, the source electrode layer 406a and the drain electrode layer 406b are provided over and in contact with the first oxide layer 404a. The oxide semiconductor layer 404b, the second oxide layer 404c, and the gate insulating layer 408 over the source electrode layer 406a and the drain electrode layer 406b are etched using the same mask. By etching the oxide semiconductor layer 404b, the second oxide layer 404c, and the gate insulating layer 408 in a state where the second oxide layer 404c is provided over the oxide semiconductor layer 404b, the surface of the oxide semiconductor layer 404b is not damaged by the etching, thereby fabricating a semiconductor device having stable characteristics.

A transistor 470 illustrated in FIG. 5B includes, like the transistor 440 illustrated in FIG. 4B, the source electrode layer 406a and the drain electrode layer 406b having stepped-shape periphery portions. Such a structure improves the coverage of the oxide semiconductor layer 404b, the second oxide layer 404c, and the gate insulating layer 408.

The transistors described in this embodiment can be combined as appropriate with any of the other embodiments.

Embodiment 2

Figure 6A:
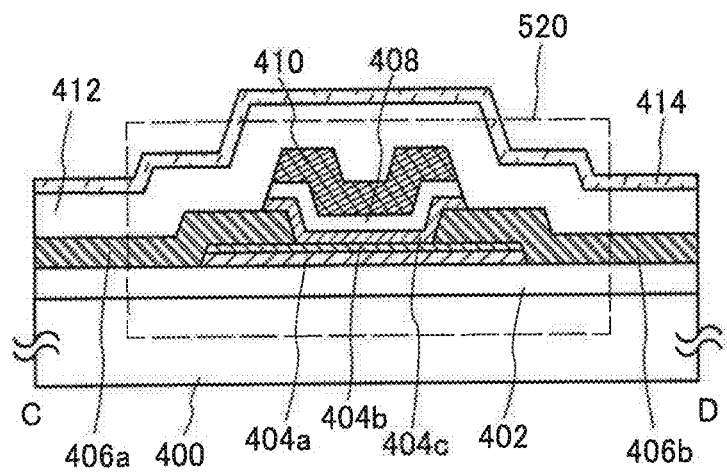
FIGS. 6A and 6B are a cross-sectional view and a top view illustrating a semiconductor device of one embodiment of the present invention.
Figure 6B:
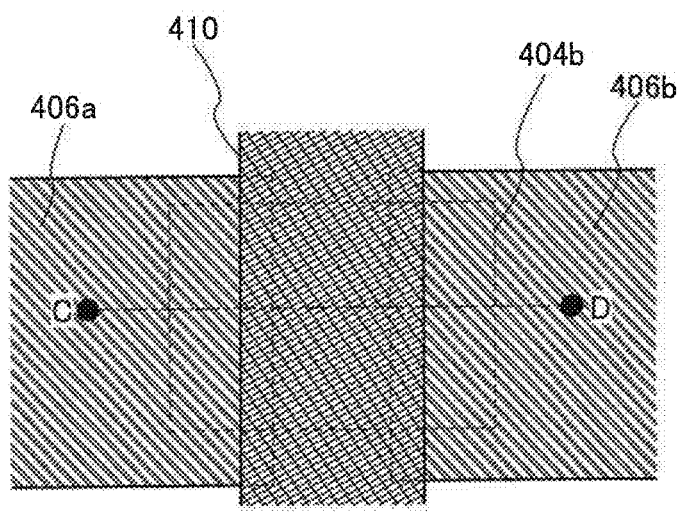

In this embodiment, semiconductor devices each having a different structure from the structures in Embodiment 1 will be described. Note that in this embodiment, portions that are similar to the portions in Embodiment 1 are denoted by the same reference numerals, and detailed description thereof is omitted. FIGS. 6A and 6B illustrate a semiconductor device of this embodiment. FIG. 6B is a top view of the semiconductor device of this embodiment. FIG. 6A is a cross-sectional view taken along the dashed line C-D in FIG. 6B.

A transistor 520 illustrated in FIG. 6A includes the base insulating layer 402 over the substrate 400; the first oxide layer 404a and the oxide semiconductor layer 404b over the base insulating layer 402; the source electrode layer 406a and the drain electrode layer 406b over the first oxide layer 404a and the oxide semiconductor layer 404b; the second oxide layer 404c over the source electrode layer 406a and the drain electrode layer 406b; the gate insulating layer 408 over the second oxide layer 404c; the gate electrode layer 410 over the gate insulating layer 408; the oxide insulating layer 412 over the source electrode layer 406a, the drain electrode layer 406b, the second oxide layer 404c, the gate insulating layer 408, and the gate electrode layer 410; and the insulating layer 414 over the oxide insulating layer 412.

A top end portion of the second oxide layer 404c is aligned with a bottom end portion of the gate insulating layer 408. A top end portion of the gate insulating layer 408 is aligned with a bottom end portion of the gate electrode layer 410. This structure can be formed by etching the gate insulating layer 408 and the second oxide layer 404c using the gate electrode layer 410 as a mask. The use of the gate electrode layer 410 as a mask can reduce the number of masks.

Note that the expression "aligned with" here does not require exact alignment, and includes the degree of equality in a shape obtained by etching of a plurality of layers with one mask. Accordingly, the top end portion of the second oxide layer 404c may protrude or recede from the bottom end portion of the gate insulating layer 408 and the top end portion of the gate insulating layer 408 may protrude or recede from the bottom end portion of the gate electrode layer 410.

The structure of the transistor described in this embodiment is not limited to the above structure. For example, as illustrated in a transistor 530 in FIG. 7A, a periphery portion of the source electrode layer 406a and a periphery portion of the drain electrode layer 406b which overlap with the gate electrode layer 410 may each have a stepped shape, like the transistor 440 illustrated in FIG. 4B.

Figure 7A:
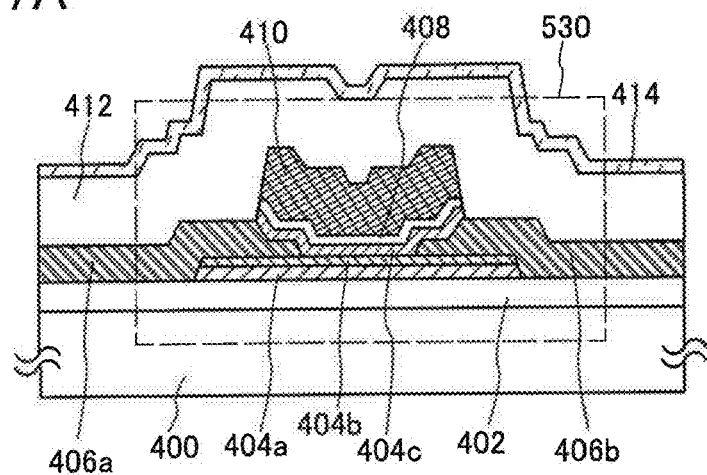
FIGS. 7A to 7C are cross-sectional views each illustrating a semiconductor device of one embodiment of the present invention.
Figure 7B:
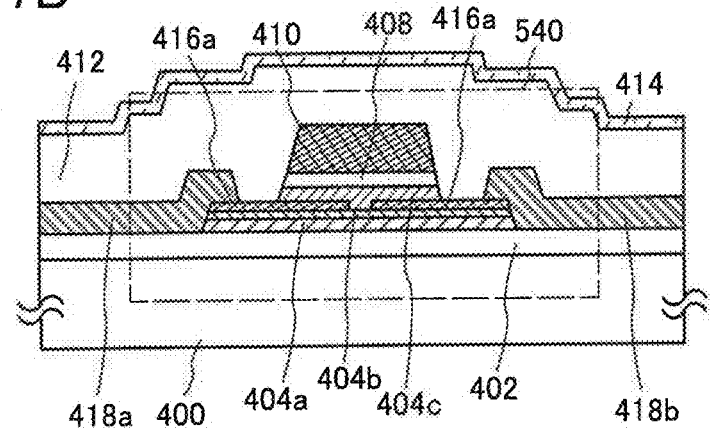

As illustrated in a transistor 540 in FIG. 7B, the source electrode layer and the drain electrode layer may have a two-layer structure, like the transistor 450 illustrated in FIG. 4C.

Figure 7C:
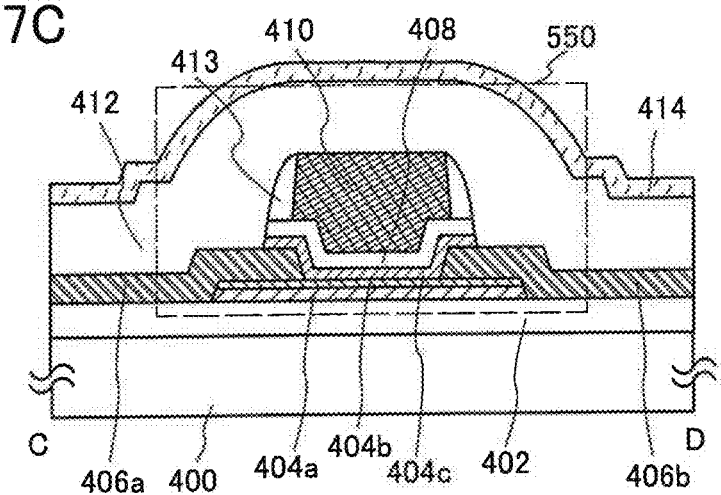

As in a transistor 550 illustrated in FIG. 7C, a sidewall insulating layer 413 may be formed in contact with a side surface of the gate electrode layer 410.

The transistor 550 includes the base insulating layer 402 over the substrate 400; the stack of the first oxide layer 404a and the oxide semiconductor layer 404b over the base insulating layer 402; the source electrode layer 406a and the drain electrode layer 406b over the first oxide layer 404a and the oxide semiconductor layer 404b; the second oxide layer 404c over the source electrode layer 406a and the drain electrode layer 406b; the gate insulating layer 408 over the second oxide layer 404c; the gate electrode layer 410 over the gate insulating layer 408; the sidewall insulating layer 413 covering the side surface of the gate electrode layer 410; the oxide insulating layer 412 over the source electrode layer 406a, the drain electrode layer 406b, the gate electrode layer 410, and the sidewall insulating layer 413; and the insulating layer 414 over the oxide insulating layer 412.

A bottom end portion of the sidewall insulating layer 413 is aligned with the top end portion of the gate insulating layer 408. The bottom end portion of the gate insulating layer 408 is aligned with the top end portion of the second oxide layer 404c. This structure can be formed by etching the gate insulating layer 408 and the second oxide layer 404c using the sidewall insulating layer 413 and the gate electrode layer 410 as masks. Note that the expression "aligned with" here does not require exact alignment, and includes the degree of equality in a shape obtained by etching of a plurality of layers with one mask. Accordingly, the top end portion of the second oxide layer 404c may protrude or recede from the bottom end portion of the gate insulating layer 408 and the top end portion of the gate insulating layer 408 may protrude or recede from the bottom end portion of the sidewall insulating layer 413.

By providing the sidewall insulating layer 413, the insulating properties between the gate electrode layer 410 and the source electrode layer 406a and between the gate electrode layer 410 and the drain electrode layer 406b can be enhanced.

Here, a method for fabricating the transistor 550 will be described. Note that description of portions that are similar to the portions in Embodiment 1 is omitted.

Figure 8A:
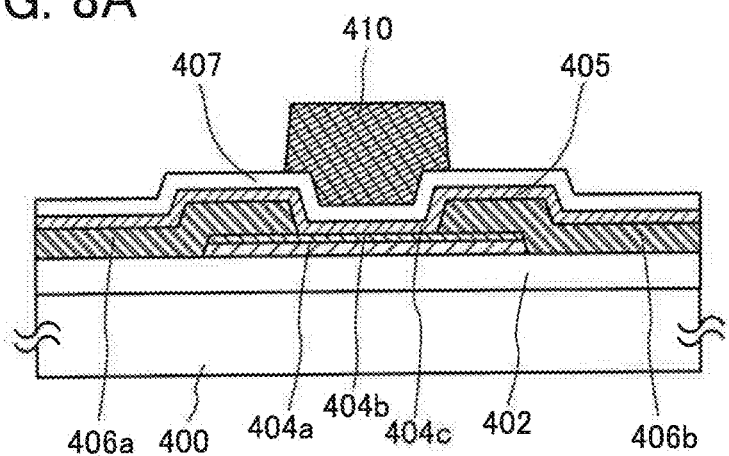
FIGS. 8A to 8C are cross-sectional views illustrating a method for fabricating a semiconductor device of one embodiment of the present invention.

In the process for fabricating the transistor 550, steps up to the formation of the gate electrode layer 410 can be conducted in a manner similar to that of the transistor 420 described in Embodiment 1. FIG. 8A corresponds to FIG. 2D. Therefore, for the method for forming the structure illustrated in FIG. 8A, refer to the description in Embodiment 1.

The transistor illustrated in FIG. 8A includes the base insulating layer 402 over the substrate 400; a stack of the first oxide layer 404a and the oxide semiconductor layer 404b over the base insulating layer 402; the source electrode layer 406a and the drain electrode layer 406b over the oxide semiconductor layer 404b; the oxide film 405 over the source electrode layer 406a and the drain electrode layer 406b; the gate insulating film 407 over the oxide film 405; and the gate electrode layer 410 over the gate insulating film 407.

Figure 8B:
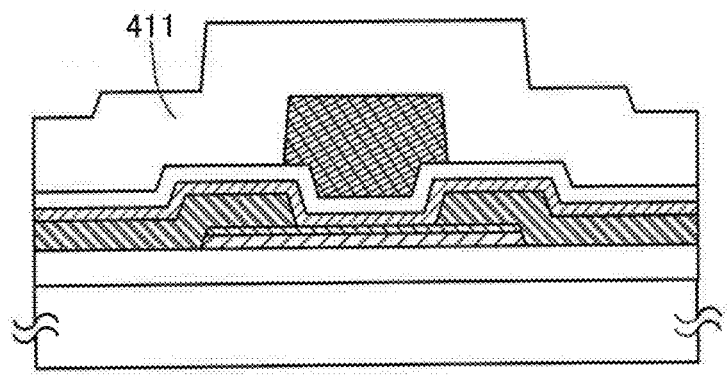
Figure 8C:
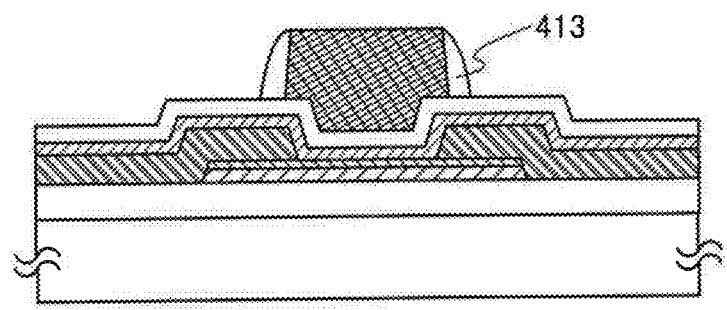

An insulating film 411 to be the sidewall insulating layer 413 is formed over the gate electrode layer 410 (see FIG. 8B). The insulating film 411 can be formed using a method and a material similar to those for the oxide insulating layer 412 described in Embodiment 1. Then, the insulating film 411 is subjected to anisotropic etching to form the sidewall insulating layer 413 (see FIG. 8C).

Figure 9A:
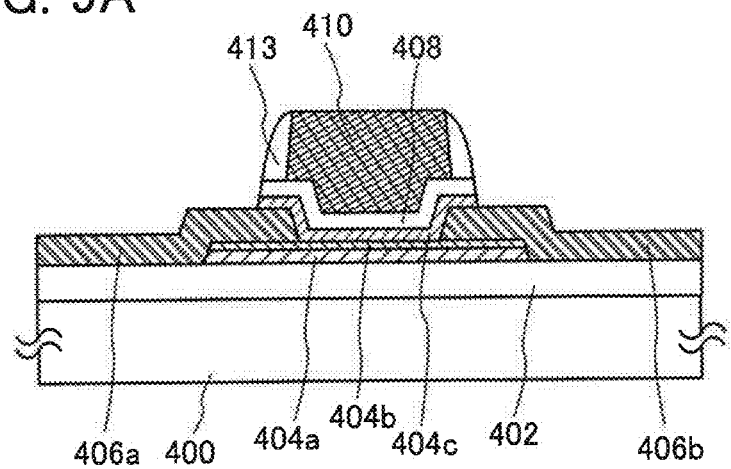
FIGS. 9A and 9B are cross-sectional views illustrating a method for fabricating a semiconductor device of one embodiment of the present invention.

Next, the oxide film 405 and the gate insulating film 407 are selectively etched using the sidewall insulating layer 413 and the gate electrode layer 410 as masks to form the second oxide layer 404c and the gate insulating layer 408 (see FIG. 9A).

In this etching for forming the second oxide layer 404c and the gate insulating layer 408, the source electrode layer 406a and the drain electrode layer 406b are also etched in some cases. In addition, when the source electrode layer 406a and the drain electrode layer 406b are etched, metal removed from the layers by the etching adheres to a side surface of the second oxide layer 404c and a side surface of the gate insulating layer 408 in some cases. There is a possibility that, through the metal adhered to the side surface of the second oxide layer 404c and the side surface of the gate insulating layer 408, electrical conduction is established between the gate electrode layer 410 and the source electrode layer 406a or between the gate electrode layer 410 and the drain electrode layer 406b.

Thus, by providing the sidewall insulating layer 413, even when metal adheres to the side surface of the second oxide layer 404c and the side surface of the gate insulating layer 408 in the etching of the source electrode layer 406a and the drain electrode layer 406b, electrical conduction between the gate electrode layer 410 and the source electrode layer 406a or between the gate electrode layer 410 and the drain electrode layer 406b can be prevented.

Figure 9B:
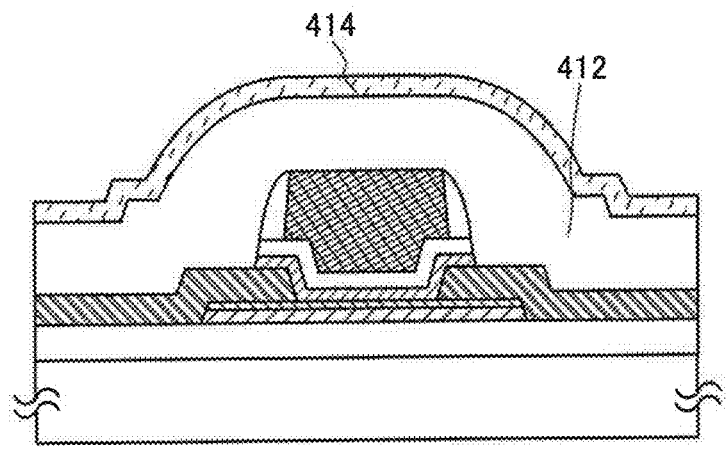

Next, the oxide insulating layer 412 and the insulating layer 414 are stacked over the source electrode layer 406a, the drain electrode layer 406b, the second oxide layer 404c, the gate insulating layer 408, the gate electrode layer 410, and the sidewall insulating layer 413 (see FIG. 9B). The oxide insulating layer 412 and the insulating layer 414 can be formed using methods and materials similar to those in Embodiment 1.

Figure 10A:
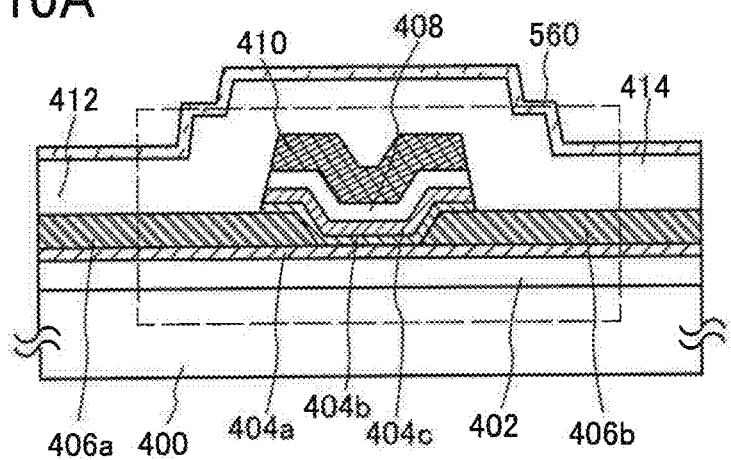
FIGS. 10A and 10B are cross-sectional views each illustrating a semiconductor device of one embodiment of the present invention.
Figure 10B:
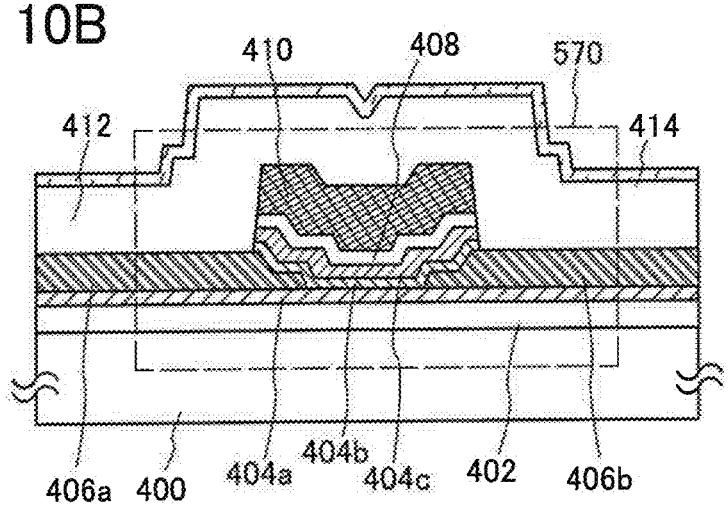

The structure of the transistor of this embodiment is not limited to the above structure, and the structures illustrated in FIGS. 10A and 10B may be employed. In FIGS. 10A and 10B, the source electrode layer 406a and the drain electrode layer 406b are formed over and in contact with the first oxide layer 404a, and the oxide semiconductor layer 404b is formed over and in contact with the source electrode layer 406a and the drain electrode layer 406b. Over the oxide semiconductor layer 404b, the second oxide layer 404c and the gate insulating layer 408 are stacked.

In a transistor 560 illustrated in FIG. 10A, as in the transistor 460 illustrated in FIG. 5A, the first oxide layer 404a is not etched and is under the source electrode layer 406a and the drain electrode layer 406b, and the oxide semiconductor layer 404b, the second oxide layer 404c, and the gate insulating layer 408 are etched using the gate electrode layer 410 as a mask.

In a transistor 570 illustrated in FIG. 10B, as in the transistor 470 illustrated in FIG. 5B, the periphery portion of the source electrode layer 406a and the periphery portion of the drain electrode layer 406b which overlap with the gate electrode layer 410 may each have a stepped shape, and the oxide semiconductor layer 404b, the second oxide layer 404c, and the gate insulating layer 408 are etched using the gate electrode layer 410 as a mask.

In the semiconductor device described in this embodiment, the first oxide layer is formed between the oxide semiconductor layer where a channel is formed and the base insulating layer, and the second oxide layer is formed between the oxide semiconductor layer and the gate insulating layer. An impurity element such as silicon is prevented from entering the oxide semiconductor layer from the base insulating layer and the gate insulating layer. Thus, change in characteristics of the transistor is suppressed.

With the structure where the source electrode layer 406a and the drain electrode layer 406b are formed in contact with the oxide semiconductor layer 404b and the second oxide layer 404c is formed over the source electrode layer 406a and the drain electrode layer 406b, the thicknesses of the first oxide layer and the second oxide layer can be increased without a reduction in contact resistance between the oxide semiconductor layer 404b and the source electrode layer 406a and between the oxide semiconductor layer 404b and the drain electrode layer 406b. Such an increase in thicknesses of the first oxide layer and the second oxide layer can inhibit entry of an impurity to the oxide semiconductor layer, which leads to stable transistor characteristics.

Furthermore, owing to the second oxide layer 404c and the gate insulating layer 408 which are formed by selective etching of the oxide film 405 and the gate insulating film 407, oxygen can be supplied from the oxide insulating layer 412 formed over the second oxide layer 404c and the gate insulating layer 408 to the oxide semiconductor layer 404b. By the supply of oxygen to the oxide semiconductor layer 404b, oxygen vacancies are filled, so that transistor characteristics are stabilized, thereby providing a highly reliable semiconductor device.

In the etching of the second oxide layer 404c and the gate insulating layer 408, the use of the gate electrode layer 410 and the sidewall insulating layer 413 as masks can reduce the number of masks.

Besides, owing to the sidewall insulating layer 413 formed in contact with the side surface of the gate electrode layer 410, electrical conduction between the gate electrode layer 410 and the source electrode layer 406a and between the gate electrode layer 410 and the drain electrode layer 406b can be prevented, which leads to high reliability of the transistor.

The transistors described in this embodiment can be combined as appropriate with any of the other embodiments.

Embodiment 3

Figure 11A:
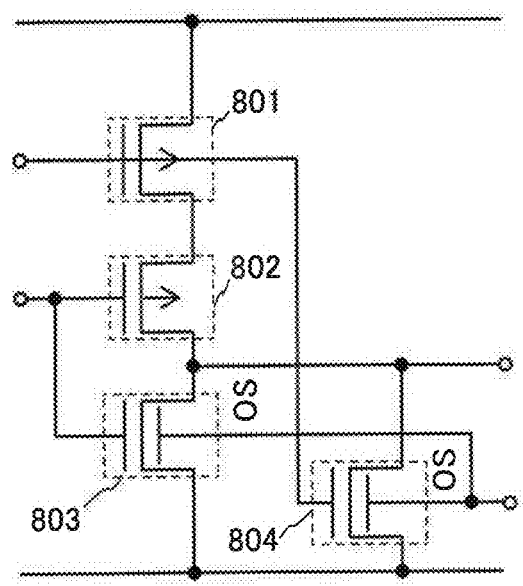
FIGS. 11A and 11B are circuit diagrams each illustrating a semiconductor device of one embodiment of the present invention.
Figure 11B:
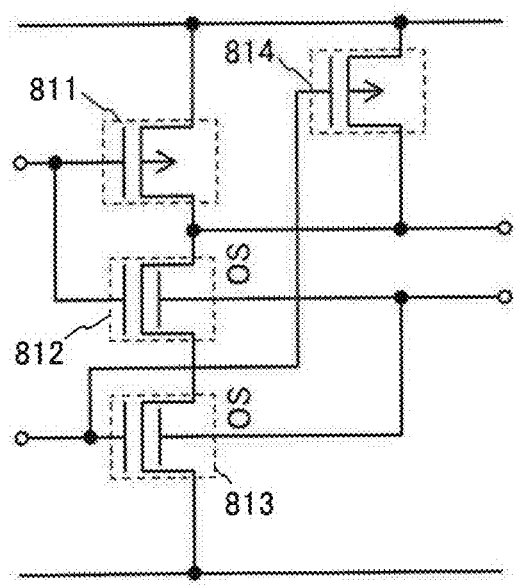

FIG. 11A illustrates an example of a circuit diagram of a NOR circuit, which is a logic circuit, as an example of the semiconductor device. FIG. 11B is a circuit diagram of a NAND circuit.

In the NOR circuit illustrated in FIG. 11A, p-channel transistors 801 and 802 each have a structure in which a single crystal silicon substrate is used for the channel formation region, and n-channel transistors 803 and 804 each have a structure similar to structures of the transistors the transistors described in Embodiments 1 and 2 in that an oxide semiconductor film is used for the channel formation region.

In the NOR circuit illustrated in FIG. 11A, a conductive layer controlling electrical characteristics of the transistor may be provided to overlap with a gate electrode layer with an oxide semiconductor film provided therebetween in each of the transistors 803 and 804. By controlling the potential of the conductive layer to GND, for example, the threshold voltages of the transistors 803 and 804 are increased, so that the transistors can be normally off.

In the NAND-type circuit illustrated in FIG. 11B, a transistor 812 and a transistor 813 which are n-channel transistors each have a structure similar to the structures of the transistors in Embodiments 1 and 2 in which a channel formation region is formed in an oxide semiconductor film.

In the NAND circuit illustrated in FIG. 11B, a conductive layer controlling electrical characteristics of the transistor may be provided to overlap with a gate electrode layer with an oxide semiconductor film provided therebetween in each of the transistors 812 and 813. By controlling the potential of the conductive layer to GND, for example, the threshold voltages of the transistors 812 and 813 are increased, so that the transistors can be normally off.

By using a transistor including an oxide semiconductor for the channel formation region and having extremely small off-state current for the semiconductor device in this embodiment, power consumption of the semiconductor device can be sufficiently reduced.

The use of the transistor described in Embodiment 1 or 2 enables to provide a NOR-type circuit and a NAND-type circuit which operate at a high speed, have high reliability, and show stable characteristics.

The semiconductor device of this embodiment can be combined with any of the semiconductor devices of the other embodiments as appropriate.

Embodiment 4

In this embodiment, an example of a semiconductor device (memory device) which includes any of the transistors described in Embodiments 1 and 2, which can hold stored data even when not powered, and which has an unlimited number of write cycles is described with reference to drawings.

Figure 12A:
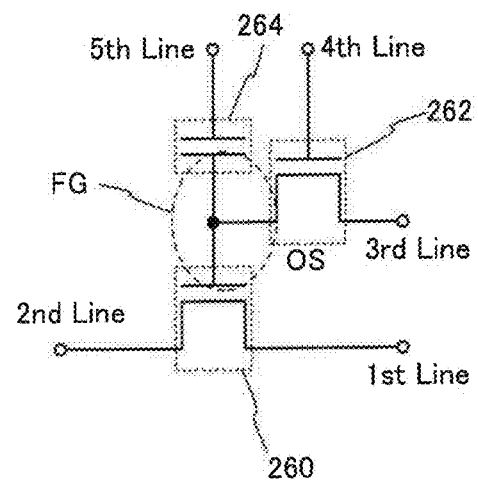
FIGS. 12A to 12C are circuit diagrams and a conceptual diagram of a semiconductor device of one embodiment of the present invention.

FIG. 12A is a circuit diagram illustrating the semiconductor device of this embodiment.

In a transistor 260 illustrated in FIG. 12A, a channel is formed in silicon, and the transistor 260 readily operates at high speed. Any of the transistors described in Embodiments 1 and 2 can be employed as a transistor 262 and the transistor 262 can hold charge for a long time owing to its characteristics.

Although all the transistors are n-channel transistors here, p-channel transistors can be used as the transistors used for the semiconductor device described in this embodiment.

In FIG. 12A, a first wiring (a 1st Line) is electrically connected to a source electrode layer of the transistor 260, and a second wiring (a 2nd Line) is electrically connected to a drain electrode layer of the transistor 260. A third wiring (3rd Line) is electrically connected to one of a source electrode layer and a drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) and the other electrode of the capacitor 264 are electrically connected to each other.

The semiconductor device illustrate in FIG. 12A utilizes a characteristic in which the potential of the gate electrode layer of the transistor 260 can be held, and thus enables data writing, holding, and reading as follows.

Writing and holding of data will be described. First, the potential of the fourth wiring is set to a potential at which the transistor 262 is turned on, so that the transistor 262 is turned on. Accordingly, the potential of the third wiring is supplied to the gate electrode layer of the transistor 260 and to the capacitor 264. That is, predetermined charge is supplied to the gate electrode layer of the transistor 260 (writing). Here, charge for supplying either of two different potential levels (hereinafter referred to as low-level charge and high-level charge) is given. After that, the potential of the fourth wiring is set to a potential at which the transistor 262 is turned off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 260. This is because in general, when the transistor 260 is an n-channel transistor, an apparent threshold voltage $V_{th\_H}$ in the case where the high-level charge is given to the gate electrode layer of the transistor 260 is lower than an apparent threshold voltage $V_{th\_L}$ in the case where the low-level charge is given to the gate electrode layer of the transistor 260. Here, an apparent threshold voltage refers to the potential of the fifth line, which is needed to turn on the transistor 260. Thus, the potential of the fifth wiring is set to a potential $V_0$ which is between $V_{th\_H}$ and $V_{th\_L}$, whereby charge given to the gate electrode layer of the transistor 260 can be determined. For example, in the case where the high-level charge is given in writing, when the potential of the fifth wiring is set to $V_0$ ($>V_{th\_H}$), the transistor 260 is turned on. In the case where the low-level charge is given in writing, even when the potential of the fifth wiring is set to $V_0$ ($<V_{th\_L}$), the transistor 260 remains in an off state. Therefore, the data held can be read by measuring the potential of the second wiring.

Note that in the case where memory cells are arrayed to be used, only data of desired memory cells needs to be read. In the case where such reading is not performed, a potential at which the transistor 260 is turned off regardless of the state of the gate electrode layer of the transistor 260, that is, a potential smaller than $V_{th\_H}$ may be given to the fifth wiring. Alternatively, a potential at which the transistor 260 is turned on regardless of the state of the gate electrode layer, that is, a potential higher than $V_{th\_L}$ may be given to the fifth wiring.

Figure 12B:
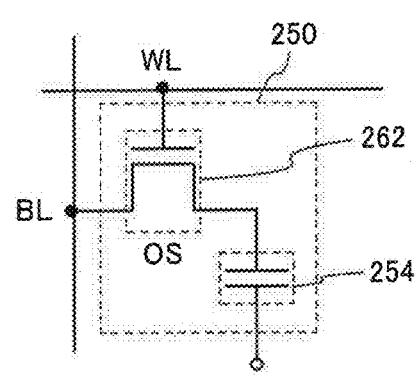
Figure 12C:
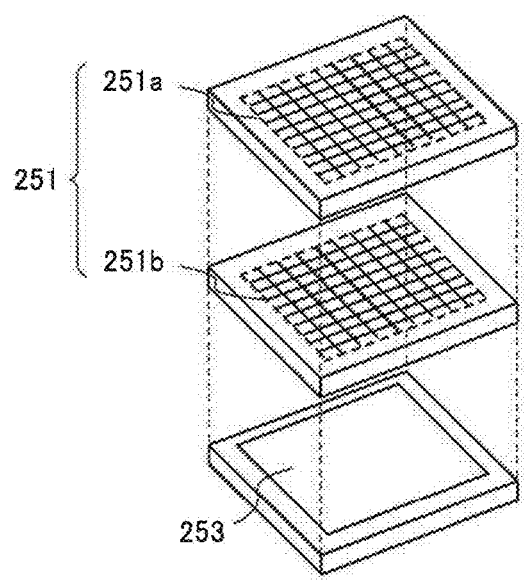

FIG. 12B illustrates another example of one embodiment of a structure of a memory device. FIG. 12B illustrates an example of a circuit configuration of a semiconductor device, and FIG. 12C is a conceptual diagram illustrating an example of a semiconductor device. First, the semiconductor device illustrated in FIG. 12B will be described, and then, the semiconductor device illustrated in FIG. 12C will be described.

In the semiconductor device illustrated in FIG. 12B, a bit line BL is electrically connected to one of the source electrode layer or the drain electrode layer of the transistor 262, a word line WL is electrically connected to the gate electrode layer of the transistor 262, and the other of the source electrode layer or the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 12B will be described.

First, the potential of the word line WL is set to a potential at which the transistor 262 is turned on, and the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or a charge accumulated in the capacitor) can be held for an extremely long period.

Next, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is represented by $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 12B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 12C will be described.

The semiconductor device illustrated in FIG. 12C includes memory cell arrays 251a and 251b including a plurality of memory cells 250 illustrated in FIG. 12B as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 12C, the peripheral circuit 253 can be provided directly under the memory cell array 251 (the memory cell arrays 251a and 251b). Thus, the size of the semiconductor device can be reduced.

It is preferable that a semiconductor material of the transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which need to operate at high speed can be favorably realized by the transistor.

Note that FIG. 12C illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

When a transistor including an oxide semiconductor in the channel formation region is used as the transistor 262, stored data can be held for a long time. In other words, power consumption can be sufficiently reduced because a semiconductor memory device in which refresh operation is unnecessary or the frequency of refresh operation is extremely low can be provided.

Further, any of the transistors described in Embodiments 1 and 2, in which the oxide semiconductor layers are stacked to form the oxide semiconductor stack and the oxide semiconductor layer to be the channel formation region is apart from the surface of the oxide semiconductor stack, is used for the semiconductor device described in this embodiment. Thus, a highly reliable semiconductor device that exhibits stable electrical characteristics can be obtained.

Embodiment 5

In this embodiment, examples of application of the semiconductor device described in any of the above embodiments to electronic devices such as a mobile phone, a smartphone, or an electronic book will be described with reference to FIG. 13, FIG. 14, FIG. 15, and FIGS. 16A and 16B.

Figure 13:
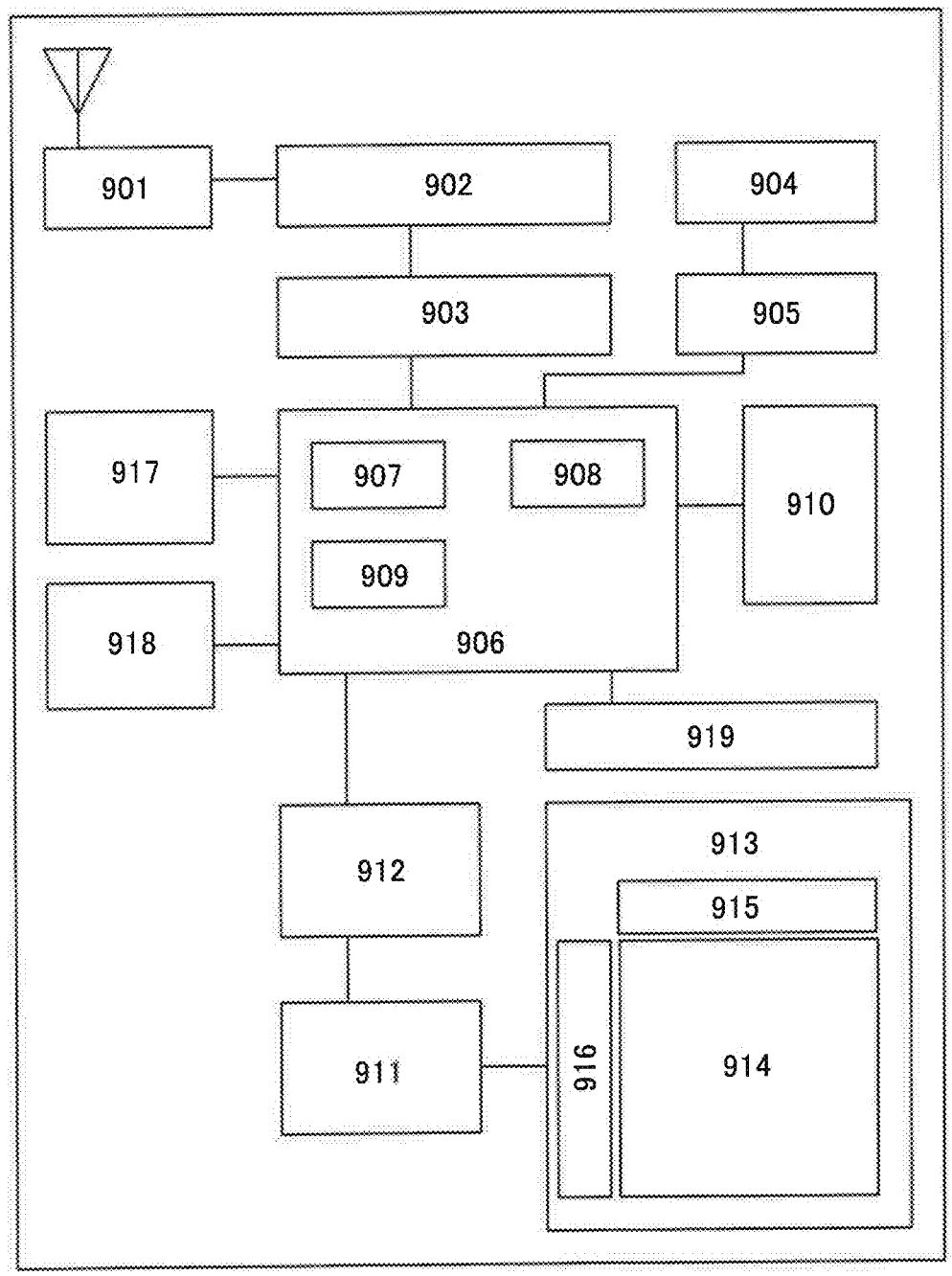
FIG. 13 is a block diagram of a semiconductor device of one embodiment of the present invention.

FIG. 13 is a block diagram of an electronic device. An electronic device illustrated in FIG. 13 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 14:
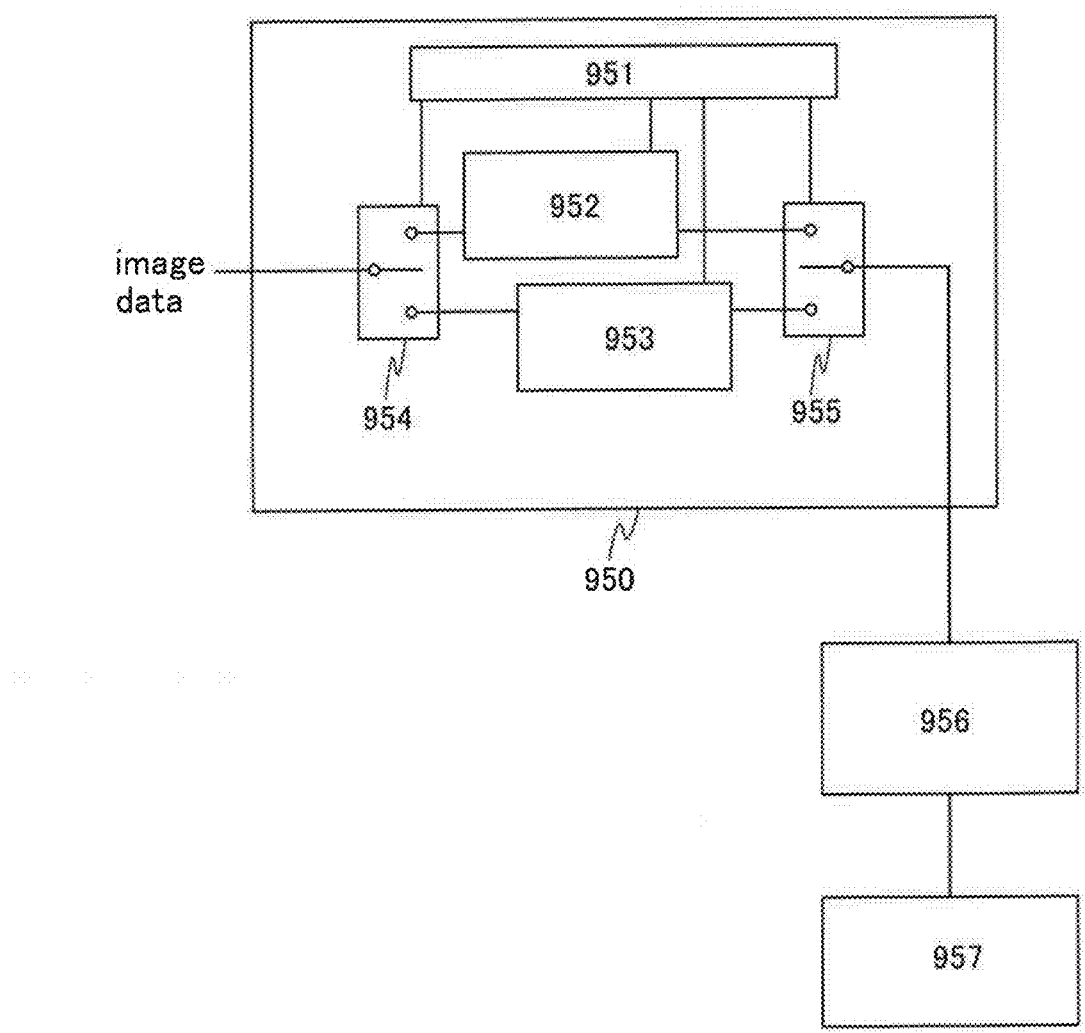
FIG. 14 is a block diagram of a semiconductor device of one embodiment of the present invention.

FIG. 14 illustrates an example in which any of the semiconductor devices described in the above embodiments is used for a memory circuit 950 in a display. The memory circuit 950 illustrated in FIG. 14 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced. Further, a semiconductor device which is hardly affected by entry of water, moisture, and the like from the outside and has high reliability can be provided.

Figure 15:
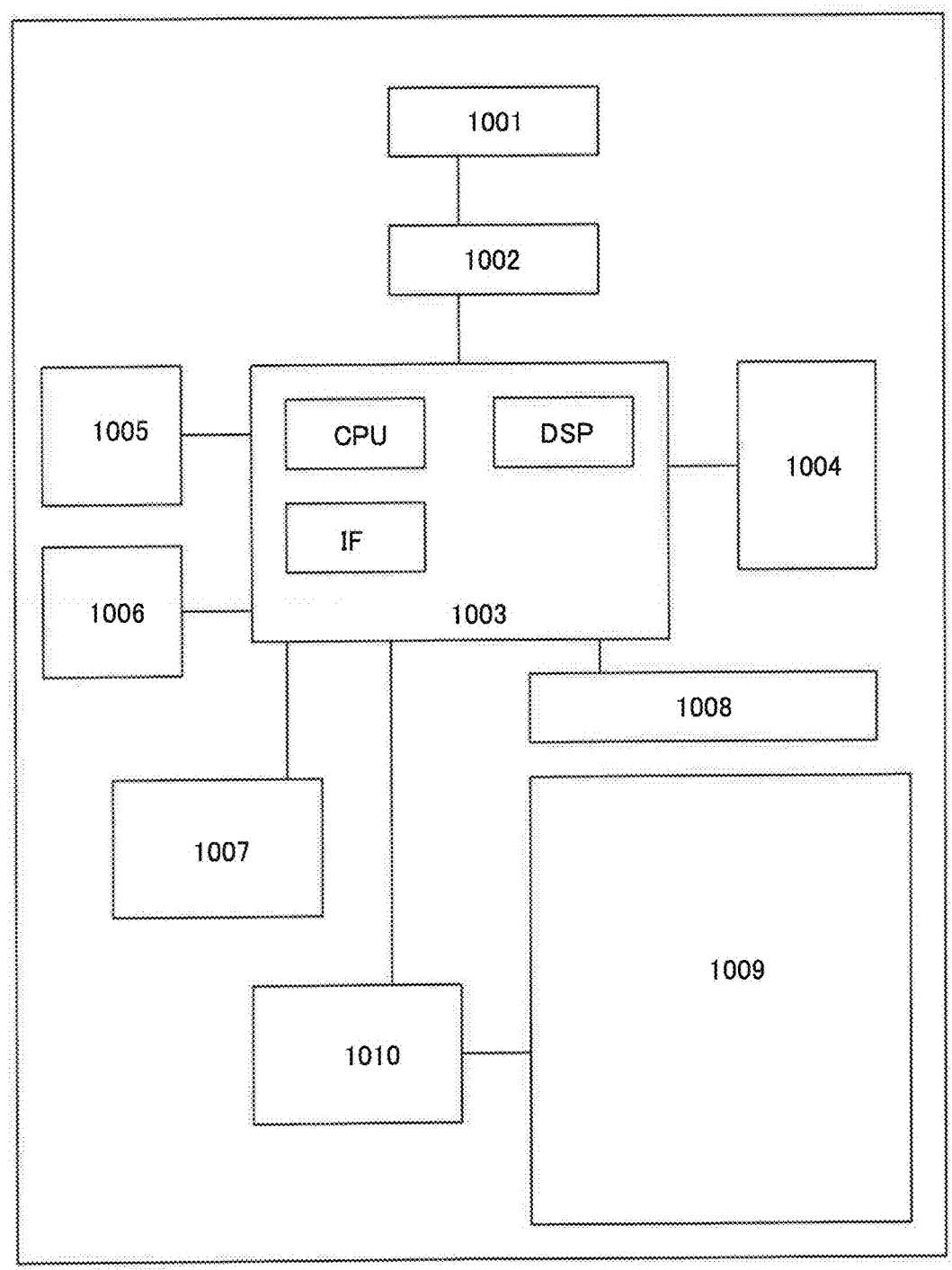
FIG. 15 is a block diagram of a semiconductor device of one embodiment of the present invention.

FIG. 15 is a block diagram of an electronic book. The electronic book in FIG. 15 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 15. The memory circuit 1007 has a function of temporarily storing the contents of a book. For example, when a user uses a highlight function, the memory circuit 1007 stores and holds data of a portion specified by the user. Note that the highlight function is used to make a difference between a specific portion and the other portions while reading an electronic book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor devices described in any of the above embodiments, data can be written and read at high speed and held for a long time, and power consumption can be sufficiently reduced. Further, a semiconductor device which is hardly affected by entry of water, moisture, and the like from the outside and which has high reliability can be provided.

Figure 16A:
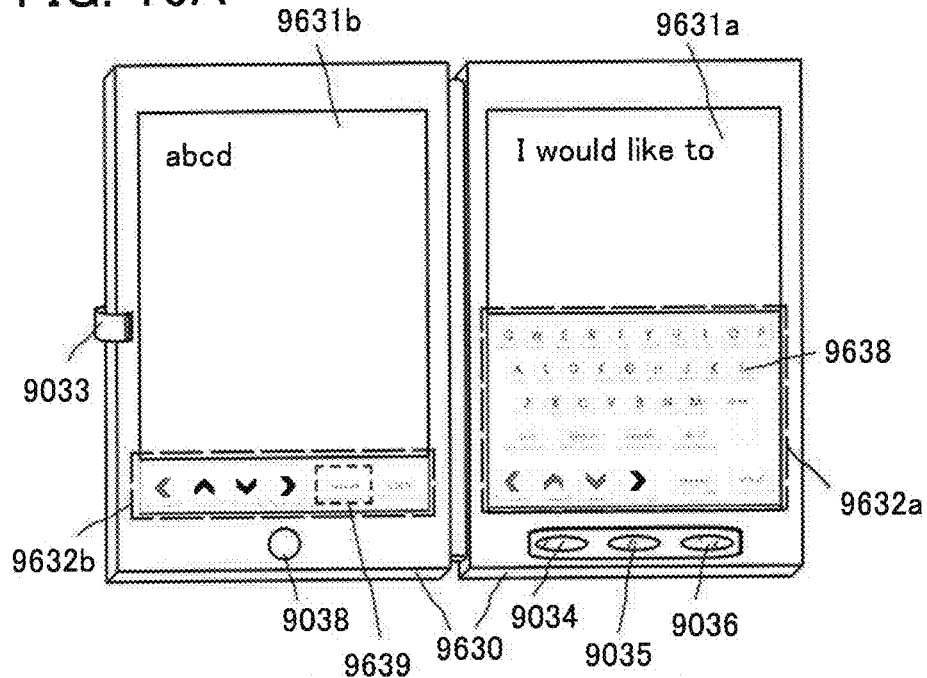
FIGS. 16A and 16B illustrate an electronic device to which a semiconductor device of one embodiment of the present invention can be applied.
Figure 16B:
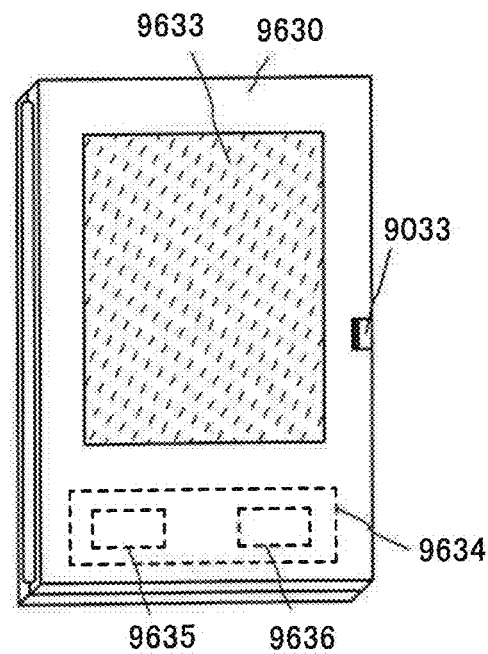

FIGS. 16A and 16B illustrate a specific example of an electronic device. FIGS. 16A and 16B illustrate a foldable tablet terminal. The tablet terminal is opened in FIG. 16A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in the above embodiment can be used for the display portion 9631a and the display portion 9631b, so that the tablet terminal can have high reliability. In addition, the memory device described in the above embodiment may be applied to the semiconductor device of this embodiment.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to the structure. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631*a* and the display portion 9631*b* have the same display area in FIG. 16A, one embodiment of the present invention is not limited to this structure. The display portion 9631*a* and the display portion 9631*b* may have different areas or different display quality. For example, one of them may be a display panel that can display higher-definition images than the other.

The tablet terminal is closed in FIG. 16B. The tablet terminal includes the housing 9630, a solar cell 9633, a charge and discharge control circuit 9634, a battery 9635, and a DCDC converter 9636. In FIG. 16B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

In addition, the tablet terminal illustrated in FIGS. 16A and 16B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The structures, methods, and the like described in this embodiment can be combined as appropriate with any of the structures, methods, and the like described in the other embodiments.

Example 1

In this example, a transistor which has the same structure as the transistor 530 illustrated in FIG. 7A was made as an example sample and the cross section of the transistor was examined.

First, a method for fabricating the example sample will be described.

First, a silicon oxide film to be a base insulating film was formed to a thickness of 300 nm over a silicon substrate. The silicon oxide film was formed by sputtering under the following conditions: mixed atmosphere of argon and oxygen (argon:oxygen=25 sccm:25 sccm); pressure, 0.4 Pa; power supply (power supply output), 5.0 kW; distance between the silicon substrate and a target, 60 mm; and substrate temperature, 100° C.

A surface of the silicon oxide film was subjected to polishing treatment, and a 20-nm-thick first oxide film and a 10-nm-thick oxide semiconductor film were stacked. The first oxide film was formed by sputtering using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C. The oxide semiconductor film was formed by sputtering using an oxide target of In:Ga:Zn=1:1:1 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 300° C. Note that the first oxide film and the oxide semiconductor film were continuously formed without exposure to the air.

Next, heat treatment was performed. The heat treatment was performed under a nitrogen atmosphere at 450° C. for one hour, and then performed under an oxygen atmosphere at 450° C. for one hour.

The first oxide film and the oxide semiconductor film were processed into an island shape by inductively coupled plasma (ICP) etching under the following conditions: mixed atmosphere of boron trichloride and chlorine ($BCl_3$:$Cl_2$=60 sccm:20 sccm); power supply, 450 W; bias power, 100 W; and pressure, 1.9 Pa.

Next, a tungsten film to be a source electrode layer and a drain electrode layer was formed to a thickness of 100 nm over the first oxide layer and the oxide semiconductor layer. The film was formed by sputtering using a tungsten target under the following conditions: argon (80 sccm) atmosphere; pressure, 0.8 Pa; power supply (power supply output), 1.0 kW; distance between the silicon substrate and the target, 60 mm; and substrate temperature, 230° C.

Then, a resist mask was formed over the tungsten film and first etching was performed thereon. The etching was performed by ICP etching under the following conditions: mixed atmosphere of chlorine, carbon tetrafluoride, and oxygen ($Cl_2$:$CF_4$:$O_2$=45 sccm:55 sccm:55 sccm); power supply, 3000 W; bias power, 110 W; and pressure, 0.67 Pa.

After the first etching, ashing with oxygen plasma was performed to reduce the resist mask in size. The resist mask was reduced in size in the same chamber where the first etching was performed, under the following conditions: oxygen atmosphere ($O_2$=100 sccm); power supply, 2000 W; bias power, 0 W; and pressure, 3.0 Pa.

Then, second etching was performed using the reduced resist mask under the following conditions: mixed atmosphere of chlorine, carbon tetrafluoride, and oxygen ($Cl_2$:$CF_4$:$O_2$=45 sccm:55 sccm:55 sccm); power supply, 3000 W; bias power, 110 W; and pressure, 0.67 Pa. By the first etching, the second etching, and the reduction of the resist performed therebetween, the source electrode layer and the drain electrode layer each having a stepped-shape periphery portion can be formed.

Next, a second oxide film was formed to a thickness of 10 nm over the oxide semiconductor layer, the source electrode layer, and the drain electrode layer. The film was formed by sputtering using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C.

Next, a silicon oxynitride film to be a gate insulating film was formed to a thickness of 20 nm by a CVD method.

A tantalum nitride film was formed to a thickness of 30 nm over the silicon oxynitride film by sputtering using a tantalum nitride target under the following conditions: nitrogen ($N_2$=50 sccm) atmosphere; pressure, 0.2 Pa; power supply, 12 kW; distance between the substrate and the target, 400 mm; and substrate temperature, room temperature. A tungsten film was formed to a thickness of 135 nm over the tantalum nitride film under the following conditions: argon (Ar=100 sccm) atmosphere; pressure, 2.0 Pa; power supply, 4 kW; distance between the substrate and the target, 60 mm; and substrate temperature, 230° C.

The stack of the tantalum nitride film and the tungsten film was etched by ICP etching. As the etching, first etching and second etching were performed. The first etching conditions were as follows: mixed atmosphere of chlorine, carbon tetrafluoride, and oxygen ($Cl_2:CF_4:O_2$=45 sccm:55 sccm:55 sccm); power supply, 3000 W; bias power, 110 W; and pressure, 0.67 Pa. The second etching was performed after the first etching under the following conditions: mixed atmosphere of boron trichloride and chlorine ($BCl_3:Cl_2$=150 sccm:50 sccm); power supply, 1000 W; bias power, 50 W; and pressure, 0.67 Pa. Thus, a gate electrode layer was formed.

The stack of the second oxide film and the gate insulating film was etched by ICP etching using the gate electrode layer as a mask. As the etching, first etching and second etching were performed. The first etching conditions were as follows: mixed atmosphere of boron trichloride and chlorine ($BCl_3:Cl_2$=60 sccm:20 sccm); power supply, 450 W; bias power, 100 W; and pressure, 1.9 Pa. After the first etching, the second etching was performed under the following conditions: oxygen ($O_2$=80 sccm) atmosphere; power supply, 300 W; bias power, 50 W; and pressure, 4.0 Pa. Thus, the second oxide layer and the gate insulating layer were formed.

Next, a silicon oxynitride film was formed to a thickness of 300 nm over the gate electrode layer by a CVD method, and a silicon nitride film was formed thereover to a thickness of 50 nm by a CVD method.

Figure 17:
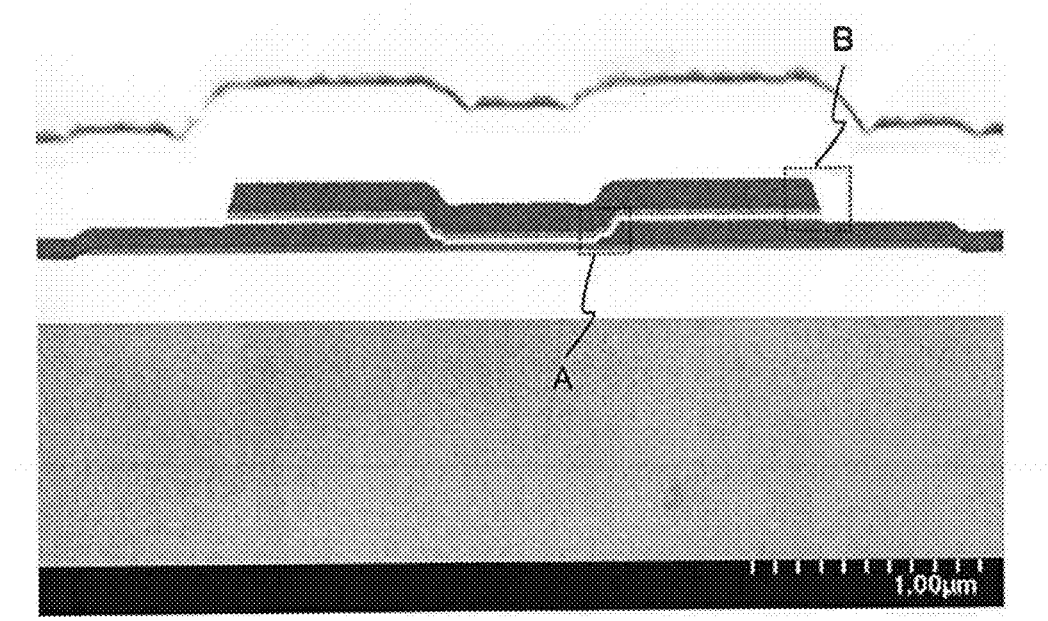
FIG. 17 is a cross-sectional STEM image of an example sample.
Figure 18A:
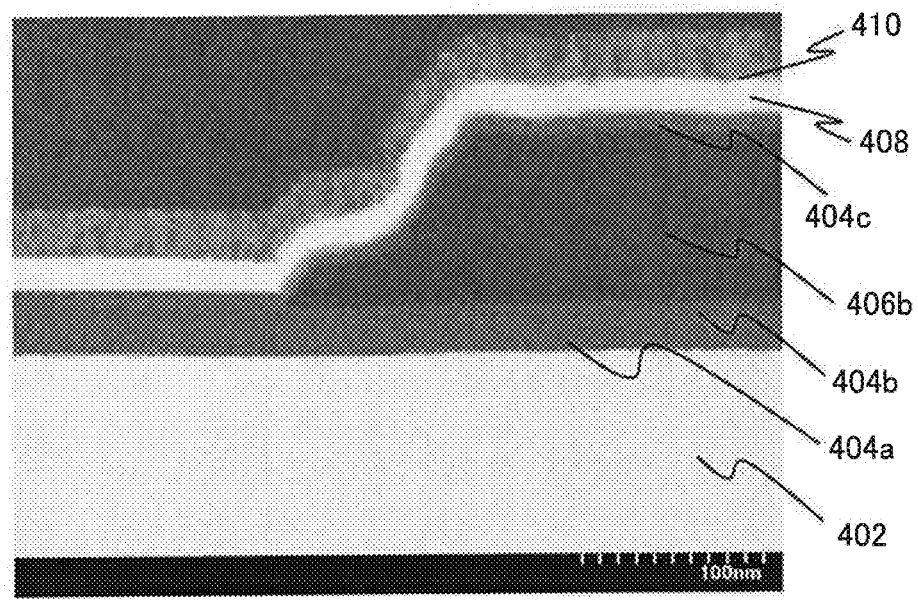
FIGS. 18A and 18B are cross-sectional STEM images of the example sample.
Figure 18B:
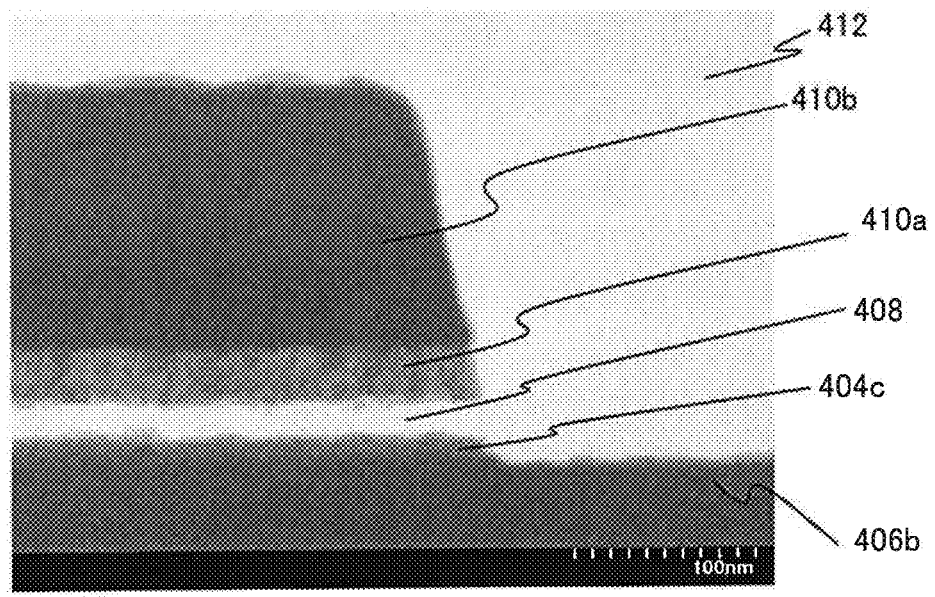

FIG. 17 is a cross-sectional STEM image of an example sample made by the above-mentioned method. FIGS. 18A and 18B are enlarged images of parts surrounded by dotted lines in FIG. 17. FIG. 18A is an enlarged image of a region A surrounded by a dotted line in FIG. 17. FIG. 18B is an enlarged image of a region B surrounded by a dotted line in FIG. 17. In FIGS. 18A and 18B, the same reference numerals as those in the transistor 530 illustrated in FIG. 7A are used.

As shown in FIG. 18A, the second oxide layer 404c is formed over the drain electrode layer 406b. It is found that the drain electrode layer 406b has a stepped-shape periphery portion, so that the coverage of the second oxide layer 404c is improved and a shape defect such as disconnection is not generated.

As shown in FIG. 18B, the second oxide layer 404c and the gate insulating layer 408 are etched using the gate electrode layer 410 as a mask. Although an interface between the gate insulating layer 408 and the oxide insulating layer 412 is not clearly observed in the STEM image, it is found that by the etching using the gate electrode layer 410 as a mask, the top end portion of the second oxide layer 404c is in contact with the bottom end portion of the gate insulating layer 408, and the top end portion of the gate insulating layer 408 is in contact with the bottom end portion of the gate electrode layer 410.

Example 2

In this example, electric characteristics of the example sample made in Example 1 were evaluated. A transistor included in the sample has a channel length (L) of 0.43 μm and a channel width (W) of 1 μm.

The example sample was subjected to BT stress tests. First, initial Vg-Id characteristics of the transistor were measured.

Note that the BT stress test is one kind of accelerated test and can evaluate, in a short time, a change in characteristics (i.e., a change with time) of a transistor, which is caused by long-term use. The amount of change in characteristics of the transistor before and after the BT stress test is an important indicator when examining the reliability of the transistor.

Note that a stress test where negative voltage is applied to a gate electrode is called negative gate BT stress test (−GBT); whereas a stress test where positive voltage is applied is called positive gate BT stress test (+GBT).

Here, the gate BT stress conditions were as follows: stress temperature, 150° C.; stress time, 3600 seconds; voltage applied to the gate electrode, −3.3 V or +3.3 V; voltage applied to the source electrode, 0 V; and voltage applied to the drain electrode, 0 V. The electric field intensity applied to the gate insulating film was 0.66 MV/cm.

Figure 21:
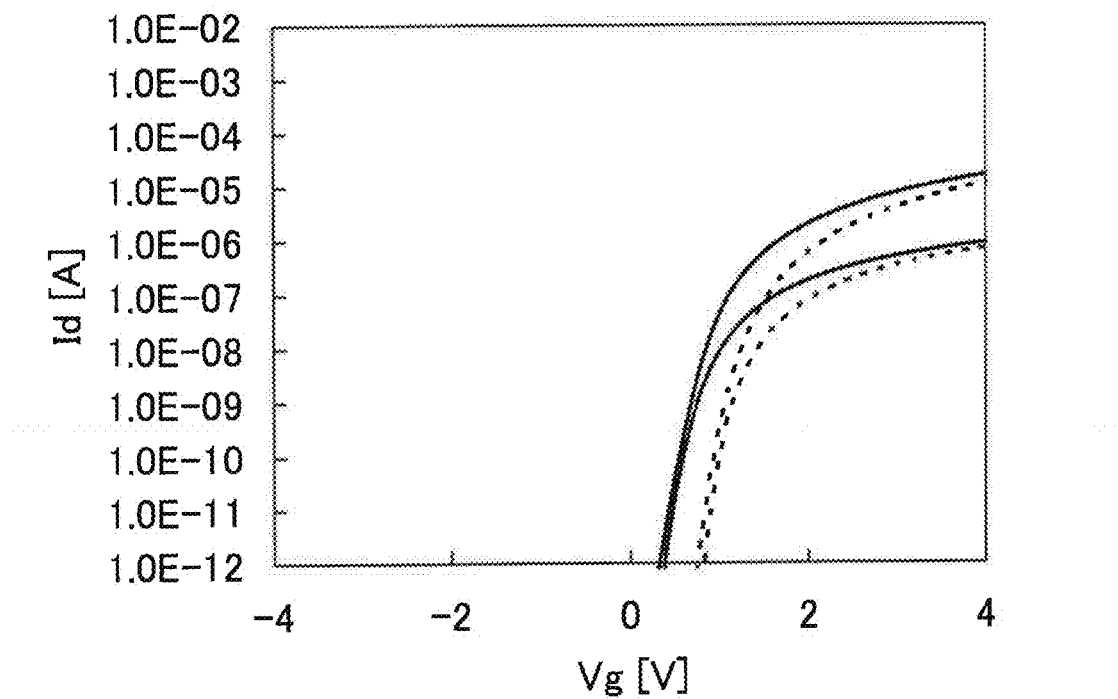
FIG. 21 is a graph showing electric characteristics of the example sample.
Figure 22:
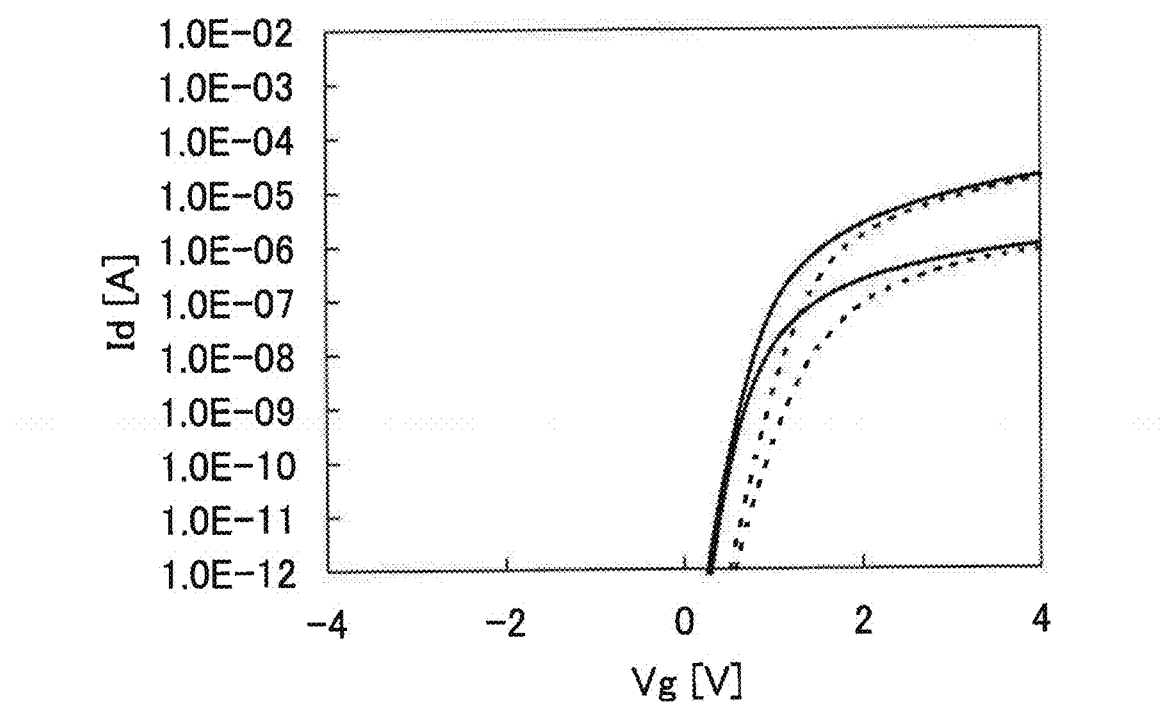
FIG. 22 is a graph showing electric characteristics of the example sample.

FIG. 21 shows the results of the +GBT stress test and FIG. 22 shows the results of the −GBT stress test. In the graphs, a dotted line indicates the initial Vg-Id characteristics of the transistor, and a solid line indicates Vg-Id characteristics of the transistor after the stress test. A horizontal axis indicates gate voltage (Vg: [V]) and a vertical axis indicates drain current (Id: [A]). The Vg-Id characteristics were measured when the drain voltage Vd was 0.1 V and 3.3 V. Note that "drain voltage (Vd: [V])" refers to a potential difference between a drain and a source when the potential of the source is used as a reference potential, and "gate voltage (Vg: [V])" refers to a potential difference between a gate and a source when the potential of the source is used as a reference potential.

As shown in FIG. 21, after the +GBT stress test, the amount of change in threshold voltage (ΔVth) is 0.54 V, and the amount of change in shift value (ΔShift) is 0.44 V. As shown in FIG. 22, after the −GBT stress test, the amount of change in threshold voltage (ΔVth) is 0.26 V, and the amount of change in shift value (ΔShift) is 0.25 V. The results in FIG. 21 and FIG. 22 show that the transistor has small amount of change and favorable switching characteristics.

A source BT stress test (SBT) and a drain BT stress test (DBT) were performed. Each of the source BT stress test and the drain BT stress test is one kind of acceleration test as well as the gate BT stress test, and can evaluate, in a short time, a change in characteristics (i.e., a change with time) of transistors, which is caused by long-term use.

First, initial Vg-Id characteristics of a transistor were measured.

Here, the source BT stress conditions were as follows: stress temperature, 150° C.; stress time, 3600 seconds; voltage applied to the drain electrode, −3.3 V; voltage applied to the source electrode, 0 V; and voltage applied to the gate electrode, 0 V. The electric field intensity applied to the gate insulating film was 0.66 MV/cm.

Here, the drain BT stress conditions were as follows: stress temperature, 150° C.; stress time, 3600 seconds; voltage applied to the drain electrode, 3.3 V; voltage applied to the source electrode, 0 V; and voltage applied to the gate electrode, 0 V. The electric field intensity applied to the gate insulating film was 0.66 MV/cm.

Figure 23:
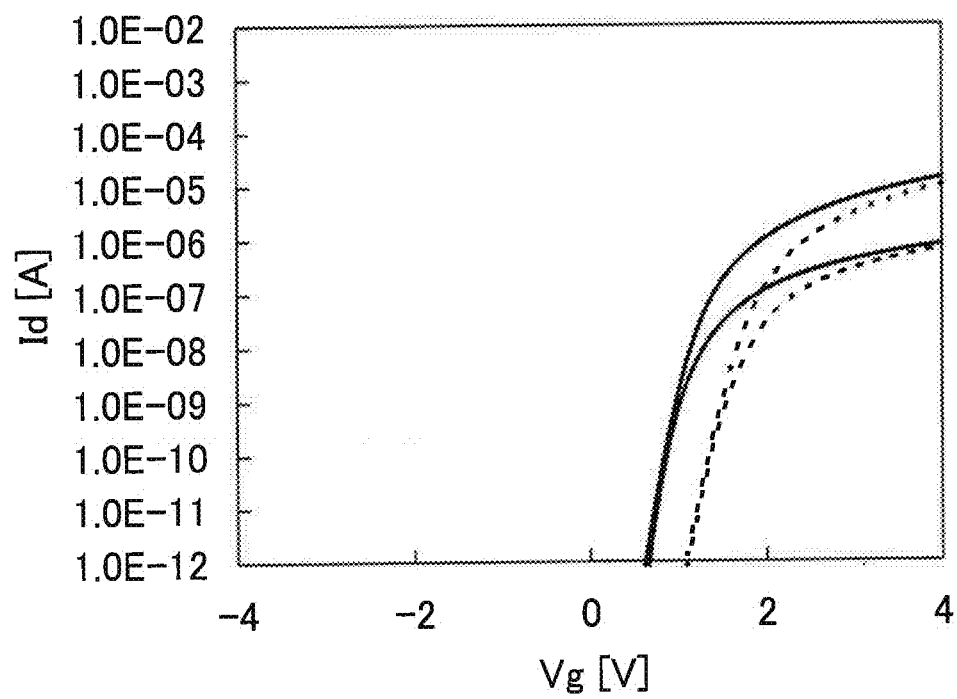
FIG. 23 is a graph showing electric characteristics of the example sample.
Figure 24:
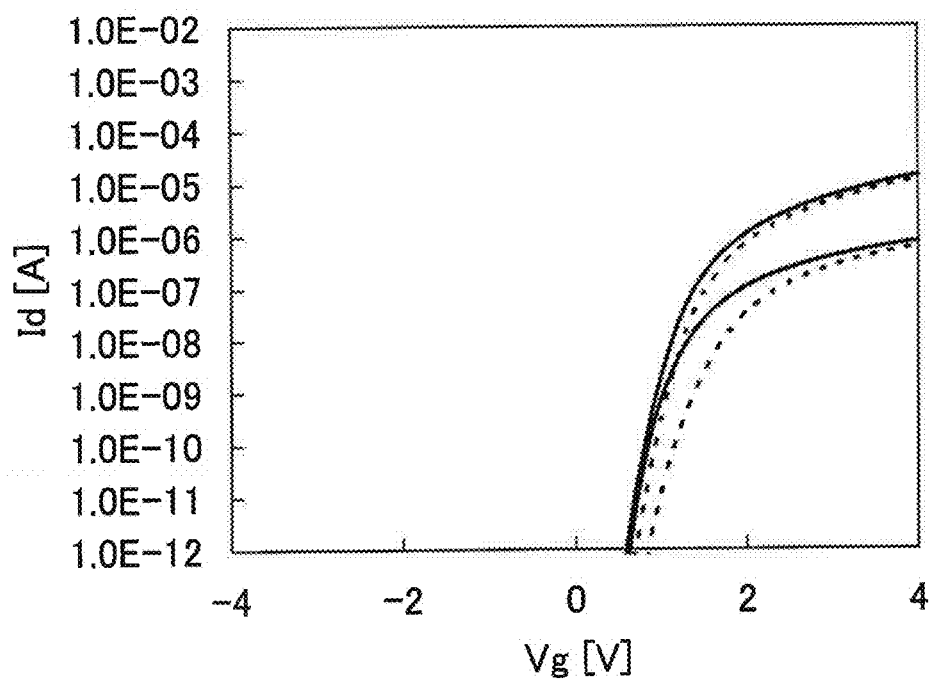
FIG. 24 is a graph showing electric characteristics of the example sample.

FIG. 23 shows the results of the SBT stress test and FIG. 24 shows the results of the DBT stress test. In the graphs, a dotted line indicates the initial Vg-Id characteristics of the transistor, and a solid line indicates Vg-Id characteristics of the transistor after the stress test. A horizontal axis indicates gate voltage (Vg: [V]) and a vertical axis indicates drain current (Id: [A]). The Vg-Id characteristics were measured when the drain voltage Vd was 0.1 V and 3.3 V.

As shown in FIG. 23, after the SBT stress test, the amount of change in threshold voltage (ΔVth) is 0.54 V, and the amount of change in shift value (ΔShift) is 0.47 V. As shown in FIG. 24, after the DBT stress test, the amount of change in threshold voltage (ΔVth) is 0.17 V, and the amount of change in shift value (ΔShift) is 0.11 V. The results in FIG. 23 and FIG. 24 show that the transistor of the example sample has small amount of change and favorable switching characteristics.

Example 3

In this example, a transistor in which an island-shaped source electrode is surrounded by a gate electrode, the gate electrode is surrounded by a drain electrode, and a first oxide layer and an oxide semiconductor layer are located between the island-shaped source electrode and the drain electrode was made as an example sample, and electric characteristics of the transistor were evaluated. Note that Example 1 can be referred to except for compositions of the first oxide layer and the oxide semiconductor layer and the structures of the above-described source electrode, drain electrode, and gate electrode.

In the transistor of this example, a lead wiring is electrically connected to each of the source electrode, the drain electrode, and the gate electrode.

The first oxide layer was formed to a thickness of 20 nm by sputtering using an oxide target of In:Ga:Zn=1:3:2 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 200° C. The oxide semiconductor film was formed to a thickness of 15 nm by sputtering using an oxide target of In:Ga:Zn=1:1:1 (atomic ratio) under the following conditions: mixed atmosphere of argon and oxygen (argon:oxygen=30 sccm:15 sccm); pressure, 0.4 Pa; power supply, 0.5 kW; distance between the substrate and the target, 60 mm; and substrate temperature, 300° C. Note that the first oxide film and the oxide semiconductor film were continuously formed without exposure to the air.

Note that the transistor has a channel length (L) of 1.13 μm and a channel width (W) of 13.6 μm.

Figure 25:
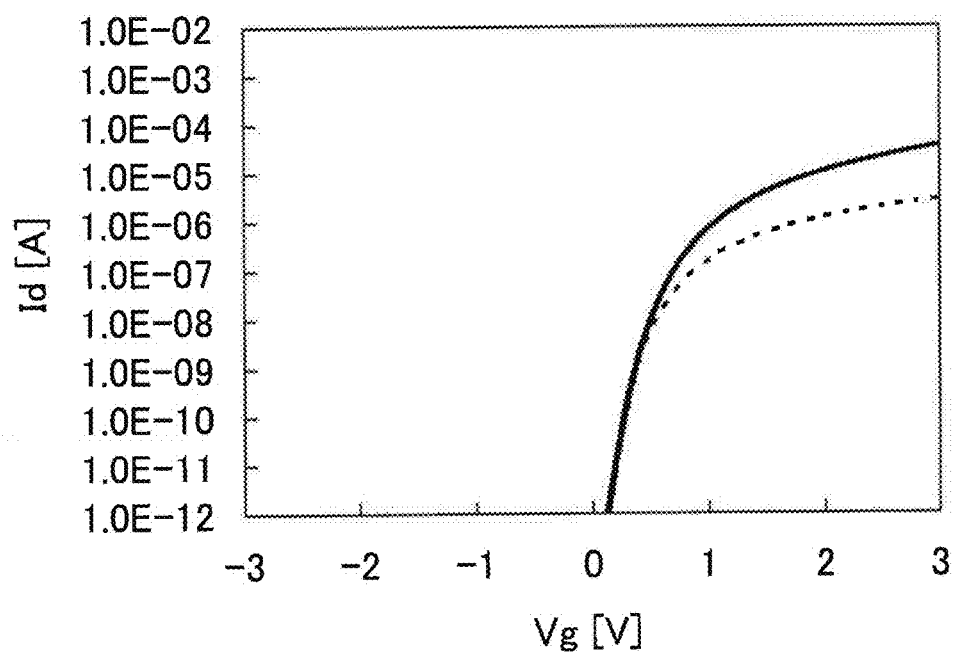
FIG. 25 is a graph showing electric characteristics of the example sample.

Next, FIG. 25 shows the measurement results of initial Vg-Id characteristics of the transistor. In FIG. 25, the measurement results when the drain voltage (Vd: [V]) is 0.1 V (a dotted line in FIG. 25) and when the drain voltage (Vd: [V]) is 3.0 V (a solid line in FIG. 25) are shown, and the horizontal axis indicates gate voltage (Vg: [V]) and the vertical axis indicates drain current (Id: [A]).

The transistor can have excellent electric characteristics as shown in FIG. 25 where the on-state current is 38 μA when each of the gate voltage and the drain voltage is 3 V, the shift value at a drain voltage of 3 V is 0.1 V, and the subthreshold swing value at a drain voltage of 0.1 V is 84.3 mV/dec.

This application is based on Japanese Patent Application serial no. 2012-203385 filed with Japan Patent Office on Sep. 14, 2012, the entire contents of which are hereby incorporated by reference.

What is claimed is:

1. A method for fabricating a semiconductor device, comprising the steps of:
   stacking a first oxide layer and an oxide semiconductor layer;
   forming a source electrode layer and a drain electrode layer over the first oxide layer and the oxide semiconductor layer;
   stacking an oxide film and a gate insulating film over the source electrode layer and the drain electrode layer;
   forming a gate electrode layer over the oxide film and the gate insulating film;
   forming an oxide insulating layer over the gate insulating film and the gate electrode layer;
   etching the oxide insulating layer to form a sidewall insulating layer in contact with a side surface of the gate electrode layer; and
   etching the oxide film and the gate insulating film using the sidewall insulating layer and the gate electrode layer as masks so that a second oxide layer and a gate insulating layer are formed.

2. The method for fabricating the semiconductor device according to claim 1, wherein each of the first oxide layer, the second oxide layer, and the oxide semiconductor layer contains indium, zinc, and gallium.

3. The method for fabricating the semiconductor device according to claim 1,
   wherein an upper surface of the source electrode layer is in direct contact with the second oxide layer, and
   wherein an upper surface of the drain electrode layer is in direct contact with the second oxide layer.

4. The method for fabricating the semiconductor device according to claim 1,
   wherein the source electrode layer comprises a stepped-shape near the drain electrode layer, and
   wherein the drain electrode layer comprises a stepped-shape near the source electrode layer.

5. The method for fabricating the semiconductor device according to claim 1,
   wherein a side surface of the sidewall insulating layer is aligned with a side surface of the gate insulating layer.

6. The method for fabricating the semiconductor device according to claim 5,
   wherein the side surface of the gate insulating layer is aligned with a side surface of the second oxide layer.

* * * * *